United States Patent
Shounai

(10) Patent No.: US 12,323,171 B2
(45) Date of Patent: Jun. 3, 2025

(54) RADIO FREQUENCY MODULE AND COMMUNICATION DEVICE

(71) Applicant: Murata Manufacturing Co., Ltd., Nagaokakyo (JP)

(72) Inventor: Hiroki Shounai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 690 days.

(21) Appl. No.: 17/713,230

(22) Filed: Apr. 5, 2022

(65) Prior Publication Data

US 2022/0278703 A1 Sep. 1, 2022

Related U.S. Application Data

(63) Continuation of application No. PCT/JP2020/031152, filed on Aug. 18, 2020.

(30) Foreign Application Priority Data

Oct. 31, 2019 (JP) .................................. 2019-199460

(51) Int. Cl.
*H04B 1/04* (2006.01)
*H04B 1/00* (2006.01)
*H04B 1/18* (2006.01)

(52) U.S. Cl.
CPC .......... *H04B 1/0458* (2013.01); *H04B 1/0057* (2013.01); *H04B 1/18* (2013.01)

(58) Field of Classification Search
CPC ...... H04B 1/0458; H04B 1/0057; H04B 1/18; H04B 1/38; H04B 1/04; H04B 2001/0408;

(Continued)

(56) References Cited

U.S. PATENT DOCUMENTS

| 11,037,893 B2* | 6/2021 | Wallis | H03F 1/3205 |
| 2003/0076659 A1* | 4/2003 | Ichitsubo | H01L 25/162 |
| | | | 361/748 |

(Continued)

FOREIGN PATENT DOCUMENTS

| JP | 2000-31331 A | 1/2000 |
| JP | 2003-204013 A | 7/2003 |

(Continued)

OTHER PUBLICATIONS

English Translation of the Written Opinion mailed on Nov. 17, 2020, received for PCT Application PCT/JP2020/031152.

(Continued)

*Primary Examiner* — Marcos L Torres
(74) *Attorney, Agent, or Firm* — XSENSUS LLP

(57) ABSTRACT

An output matching circuit includes a plurality of inductor parts and is connected to an output pad electrode of a power amplifier. In a radio frequency module, a second principal surface of a first wiring board and a third principal surface of a second wiring board are on opposite sides of the radio frequency module. An external connection terminal is arranged on a fourth principal surface of the second wiring board. The power amplifier is arranged on a first principal surface) of the first wiring board. In the output matching circuit, at least part of a first inductor part, which is the inductor part L1 closest to the output pad electrode of the plurality of inductor parts, is arranged on the first principal surface of the first wiring board.

20 Claims, 12 Drawing Sheets

(58) Field of Classification Search
CPC . H01L 23/12; H03H 7/38; H03H 7/42; H03H 7/46
See application file for complete search history.

(56) References Cited

U.S. PATENT DOCUMENTS

2014/0126156 A1* 5/2014 Naganuma ........... H05K 1/0233
                                                                  361/720
2025/0015828 A1* 1/2025 Zhang ....................... H03J 1/00

FOREIGN PATENT DOCUMENTS

| JP | 2007-88363 A | 4/2007 |
|---|---|---|
| JP | 2014-112628 A | 6/2014 |

OTHER PUBLICATIONS

International Search Report and Written Opinion mailed on Nov. 17, 2020, received for PCT Application PCT/JP2020/031152, Filed on Aug. 18, 2020, 8 pages including English Translation.

* cited by examiner

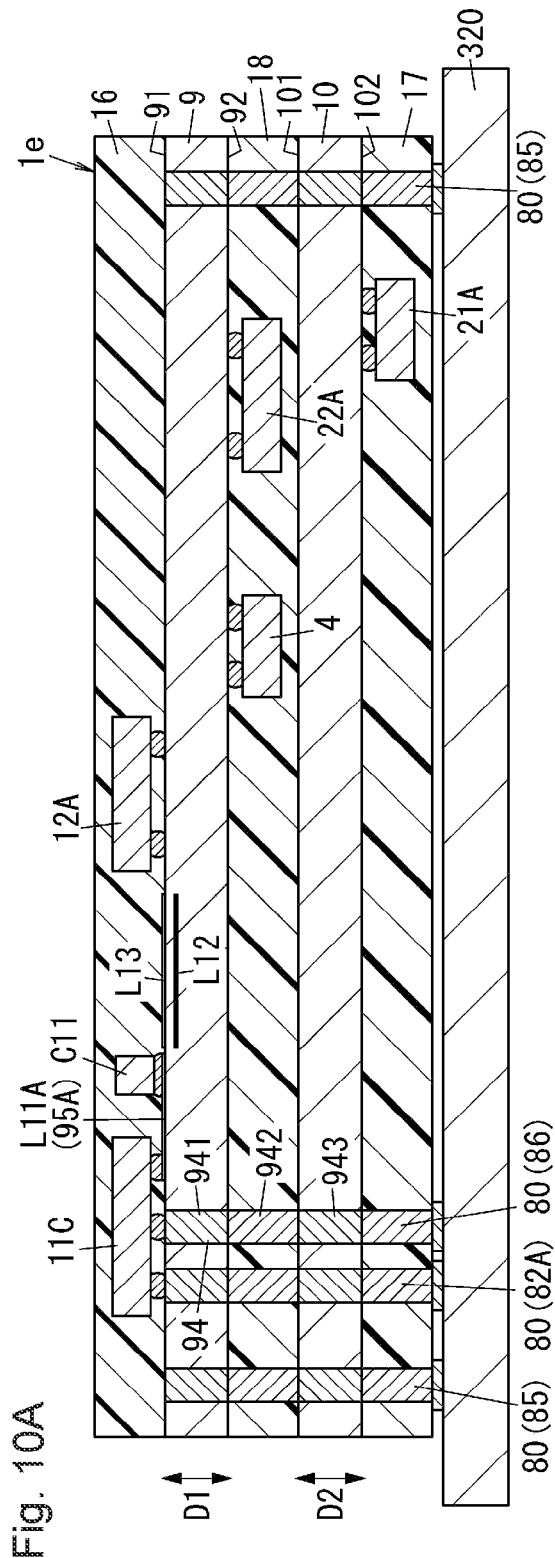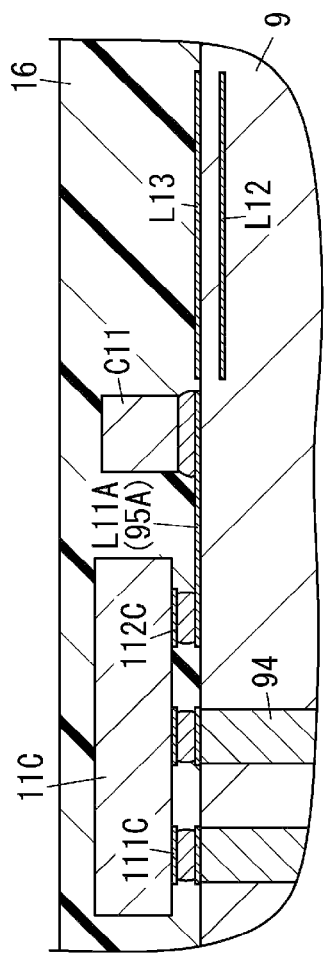
Fig. 10A
Fig. 10B

RADIO FREQUENCY MODULE AND COMMUNICATION DEVICE

CROSS-REFERENCE TO RELATED APPLICATIONS

The present application is a continuation application of International Patent Application No. PCT/JP2020/031152, filed Aug. 18, 2020, which claims priority to Japanese Patent Application No. 2019-199460, filed Oct. 31, 2019, the entire contents of each of which being incorporated herein by reference.

Technical Field

The present disclosure generally relates to radio frequency modules and communication devices, and more specifically, to a radio frequency module including a power amplifier and a communication device including such a radio frequency module.

Background Art

In general, as a radio frequency module, a power amplifier module including a wiring board, a semiconductor chip, an inductance element, and a plurality of external connection terminals is known (for example, see Patent Document 1), in which the semiconductor chip is installed (mounted) on an upper surface of the wiring board and includes a power amplifier circuit, the inductance element is installed (mounted) on the upper surface of the wiring board, and the plurality of external connection terminals are formed on a lower surface of the wiring board.

The power amplifier module includes an output matching circuit connected to the power amplifier circuit. The output matching circuit includes the inductance element described above.

CITATION LIST

Patent Document

Patent Document 1: Japanese Unexamined Patent Application Publication No. 2037-88363

SUMMARY

Technical Problems

As recognized by the present inventor, with regard to the radio frequency modules, in some cases, it is desirable to improve the Q factor of an inductor part included in the output matching circuit connected to a power amplifier.

An aspect of the present disclosure is to provide a radio frequency module and a communication device, each of which is capable of improving the Q factor of an inductor part included in an output matching circuit connected to a power amplifier.

Solutions to Problems

A radio frequency module according to one aspect of the present disclosure includes a first wiring board, a second wiring board, a power amplifier, an output matching circuit, and an external connection terminal. The first wiring board has a first principal surface and a second principal surface, the first principal surface and the second principal surface being on opposite sides of the first wiring board. The second wiring board has a third principal surface and a fourth principal surface, the third principal surface and the fourth principal surface being on opposite sides of the first wiring board. The second wiring board is separated from the first wiring board in a thickness direction of the first wiring board. The power amplifier has an output pad electrode. The output matching circuit includes a plurality of inductor parts and is connected to the output pad electrode of the power amplifier. In the radio frequency module, the second principal surface of the first wiring board and the third principal surface of the second wiring board face one another. The external connection terminal is arranged on the fourth principal surface of the second wiring board. The power amplifier is arranged on the first principal surface of the first wiring board. In the output matching circuit, at least part of a first inductor part is arranged on the first principal surface of the first wiring board, the first inductor part being an inductor part closest to the output pad electrode of the plurality of inductor parts.

A communication device according to one aspect of the present disclosure includes a signal processing circuit and the foregoing radio frequency module. The signal processing circuit outputs a transmitting signal. The power amplifier of the radio frequency module amplifies and outputs the transmitting signal from the signal processing circuit.

Advantageous Effects

The radio frequency module and the communication device according to the foregoing aspect of the present disclosure can improve the Q factor of the inductor part included in the output matching circuit connected to the power amplifier.

BRIEF DESCRIPTION OF DRAWINGS

FIG. 10A is a sectional diagram of a radio frequency module according to a second embodiment. FIG. 10B is an enlarged view of a relevant part of the radio frequency module.

DESCRIPTION OF EMBODIMENTS

Figure 1:
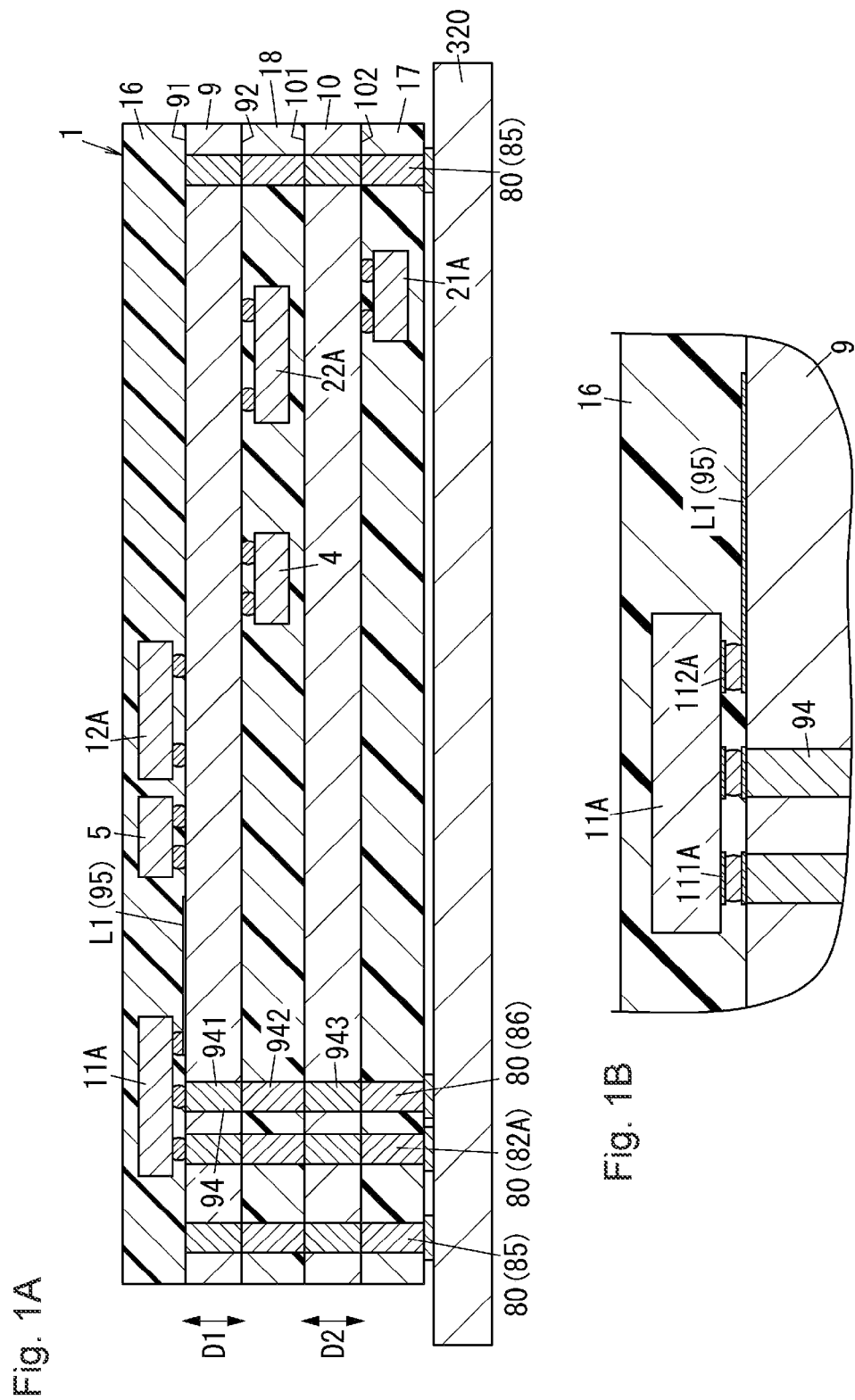
FIG. 1A is a sectional diagram of a radio frequency module according to a first embodiment.
FIG. 1B is an enlarged view of a relevant part of the radio frequency module.
Figure 2:
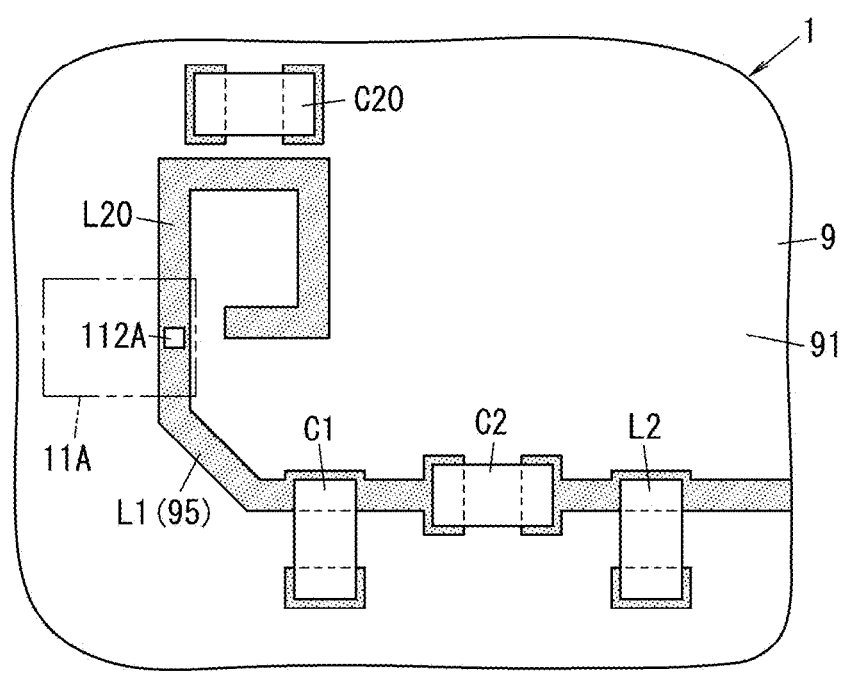
FIG. 2 is a plan view of the relevant part of the radio frequency module.

FIGS. 1A, 1B, 2, 6 to 9, 10A, 10B, 11, and 12 to be referred in the following embodiments and the like are all schematic diagrams, and each ratio of sizes or thicknesses of constituent elements in the drawings is not necessarily reflecting the actual ratio of dimensions thereof.

First Embodiment

Hereinafter, a radio frequency module 1 and a communication device 300 according to a first embodiment are described with reference to FIG. 1A to FIG. 4.

Figure 3:
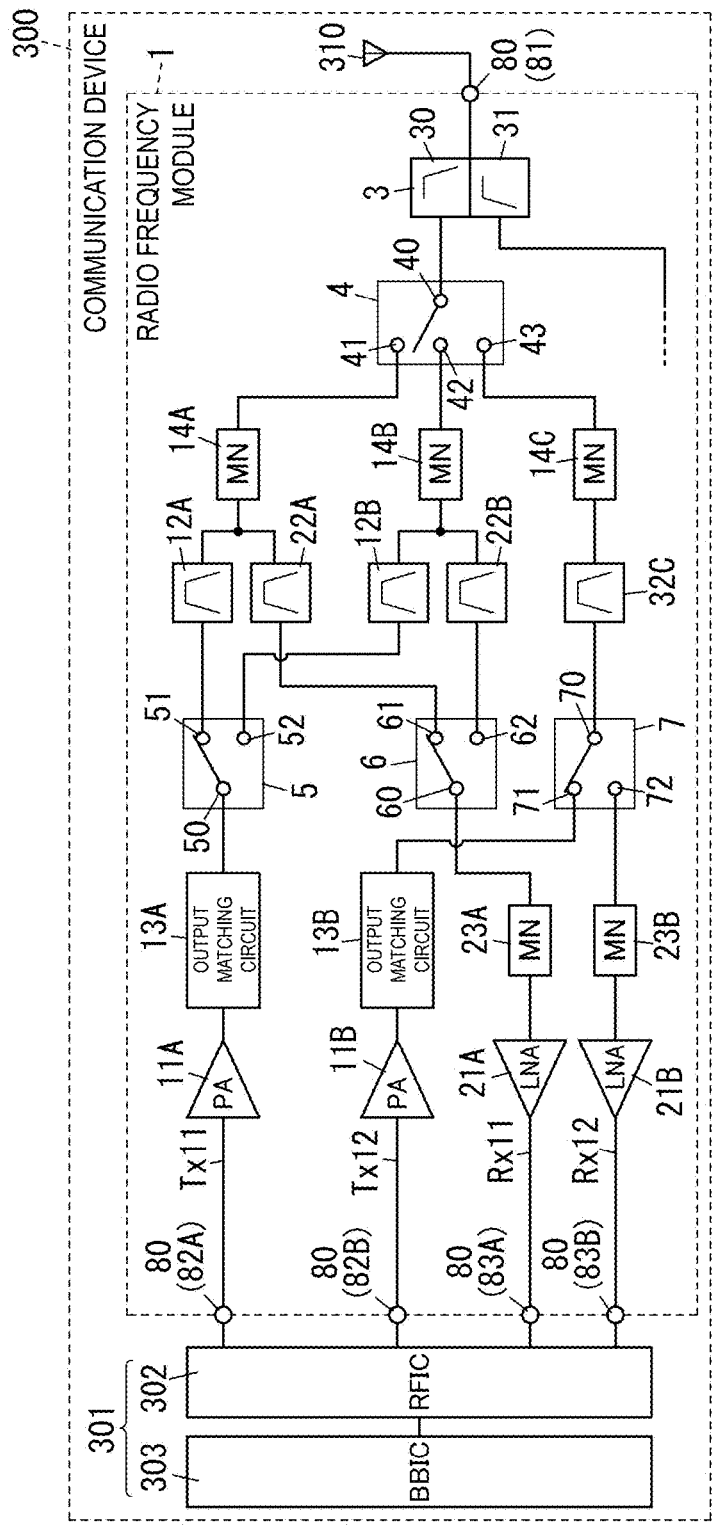
FIG. 3 is a circuit configuration diagram of a communication device including the radio frequency module.
Figure 4:
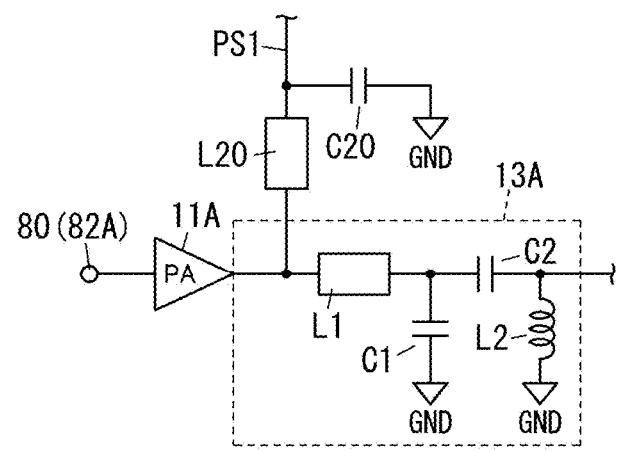
FIG. 4 is a circuit diagram of an output matching circuit of the radio frequency module.

(1) Radio Frequency Module and Communication Device (1.1) Circuit Configuration of Radio Frequency Module and Communication Device Circuit configurations of the radio frequency module 1 and the communication device 350 according to the first embodiment are described with reference to FIGS. 3 and FIG. 4.

The radio frequency module 1 according to the first embodiment is, for example, for use in the communication device 300. The communication device 300 is, for example, a mobile phone (for example, a smartphone). However, the communication device 300 is not limited thereto and may be, for example, a wearable terminal (for example, a smartwatch) ox the like. The radio frequency module 1 is, for example, a module compatible with a 4G (fourth generation mobile telecommunications) standard or a 5G (fifth generation mobile telecommunications) standard. The 4G standard is, for example, the 3GPP long term evolution (LTE) standard. The 5G standard is, for example, 5G new radio (NR). The radio frequency module 1 is a module compatible with carrier aggregation and dual connectivity.

The radio frequency module 1 is configured, for example, in such a manner as to amplify a transmitting signal input from a signal processing circuit 301 and output the amplified signal to an antenna 310. Further, the radio frequency module 1 is configured in such a manner as to amplify a received signal input from the antenna 310 and output the amplified signal to the signal processing circuit 301. The signal processing circuit 301 is not a constituent element of the radio frequency module 1 but a constituent element of the communication device 300 that includes the radio frequency module 1. The radio frequency module 1 according to the first embodiment is controlled, for example, by the signal processing circuit 301 included in the communication device 300. The communication device 300 includes the radio frequency module 1 and the signal processing circuit 301. The communication device 300 further includes the antenna 310. The communication device 300 further includes a circuit board 320 (see, FIG. 1A) on which the radio frequency module 1 is mounted. The circuit board 320 is, for example, a printed wiring board. The circuit board 320 has a ground electrode to which a ground potential is given.

The signal processing circuit 301 includes, for example, an RF signal processing circuit 302 and a baseband signal processing circuit 303. The RP signal processing circuit 302 is, for example, a radio frequency integrated circuit (RFIC) and performs signal processing on a radio frequency signal. For example, the RF signal processing circuit 302 performs signal processing, such as up-converting, on a radio frequency signal (transmitting signal) output from the baseband signal processing circuit 303 and outputs the radio frequency signal on which the signal processing has been performed. Further, for example, the KF signal processing circuit 302 performs signal processing, such as down-converting, on a radio frequency signal (received signal) output from the radio frequency module 1 and outputs the radio frequency signal on which the signal processing has been performed to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is for example, an audio signal, an image signal, or the like input from the outside. The baseband signal processing circuit 303 outputs a transmitting signal by performing 10 modulation processing by combining an I-phase signal and a Q-phase signal. At this time, the transmitting signal is generated as a modulated signal (IQ signal) in which a carrier signal having a predetermined frequency is amplitude-modulated using a period longer than the period of this carrier signal. The received signal processed in the baseband signal processing circuit 303 is used, for example, as an image signal for image display or as an audio signal for calls. The radio frequency module 1 transmits radio frequency signals (received signal and transmitting signal) between the antenna 310 and the RF signal processing circuit 302 of the signal processing circuit 301.

The radio frequency module 1 according to the first embodiment includes two power amplifiers 11A and 11B and two output matching circuits 13A and 13B. The radio frequency module 1 further includes two low noise amplifiers 21A and 21B. Further, the radio frequency module 1 includes two transmission filters 12A and 12B and two reception filters 22A and 22B. The radio frequency module 1 further includes a transmission/reception filter 32C. The radio frequency module 1 further includes a switch 4 (hereinafter, also referred to as first switch 4), a switch 5 (hereinafter, also referred to as second switch 5), a switch 6 (hereinafter, also referred to as third switch 6), and a switch 7 (hereinafter, also referred to as fourth switch 7). The radio frequency module 1 further includes a diplexer 3. The radio frequency module 1 further includes two input matching circuits 23A and 23B and three matching circuits 14A, 14B, and 14C.

Further, the radio frequency module 1 includes a plurality of external connection terminals 80. The plurality external connection terminals 60 include an antenna terminal 81, two signal input terminals 32A and 82B, two signal output terminals 83A and 83B, and a plurality of ground terminals 85 (see FIG. 1A). The plurality of ground terminals 85 are terminals that are electrically connected to the ground electrode of the foregoing circuit board 320 included in the communication device 300, and the ground potential is given to these terminals.

The power amplifier 11A is provided on a signal path Tx11 connected to the signal input terminal 82A. The power amplifier 11A is, for example, amplifies and outputs a transmitting signal from the signal processing circuit 301. More specifically, the power amplifier 11A amplifies and outputs a transmitting signal of a first predetermined frequency band input from the signal processing circuit 301 via the signal input terminal 32A. Here, the first predetermined frequency band includes, for example, a first communication band and a second communication band. The first communication band corresponds to a transmitting signal that passes through the transmission filter 12A. The second communication band corresponds to a transmitting signal that passes through the transmission filter 12B.

The power amplifier 11B is provided on a signal path Tx12 connected to the signal input terminal 82B. The power amplifier 11B is, for example, amplifies and outputs a transmitting signal from the signal processing circuit 301. More specifically, the power amplifier 11B amplifies and outputs a transmitting signal of a second predetermined frequency band input from the signal processing circuit 301 via the signal input terminal 32B. Here, the second predetermined frequency band includes, for example, a third communication band. The third communication band corresponds to a transmitting signal that passes through the transmission/reception filter 32C.

The power amplifier 11A has an input terminal (input pad electrode 111A illustrated in FIG. 1B) and an output terminal (output pad electrode 112A illustrated in FIG. 1B). The input terminal of the power amplifier 11A is connected to the signal input terminal 82A. Accordingly, the input terminal of the power amplifier 11A is connected to the signal processing circuit 301 via the signal input terminal 82A. The signal input terminal 82A is a terminal for inputting a radio frequency signal (transmitting signal) received from an external circuit (for example, the signal processing circuit 301) to the radio frequency module 1. The output terminal of the power amplifier 11A is connected to a common terminal 50 of the second switch 5 via the output matching circuit 13A. The radio frequency module 1 further includes a power line PS1 (see FIG. 4) for supplying a power supply voltage to the power amplifier 11A from an external circuit (for example, the signal processing circuit 301). The power line PS1 includes an inductor part L20 having a first end and a second end and is connected to the output terminal of the power amplifier 11A. In the power line PS1, the first end of the inductor part L20 is connected to the output terminal of the power amplifier 11A. Further, the second end of the inductor part L20 is connected to a power supply terminal (one of the plurality of external connection terminals 80) and a first end of a capacitor C20 having this first end and a second end. The second end of the capacitor C23 is connected to ground.

The power amplifier 11B has an input terminal (input pad electrode) and an output terminal (output pad electrode). The input terminal of the power amplifier 11B is connected to the signal input terminal 82B. Accordingly, the input terminal of the power amplifier 11B is connected to the signal processing circuit 301 via the signal input terminal 82B. The signal input terminal 82B is a terminal for inputting a radio frequency signal (transmitting signal) received from an external circuit (for example, the signal processing circuit 301) to the radio frequency module 1. The output terminal of the power amplifier 11B is connected to a selection terminal 71 of the fourth switch 7 via the output matching circuit 13B. The radio frequency module 1 further includes a power line for supplying a power supply voltage to the power amplifier 11B from an external circuit (for example, the signal processing circuit 301).

The radio frequency module 1 may include a controller that controls the power amplifiers 11A and 11B and the like. The controller is, for example, connected to the signal processing circuit 301 via a plurality of (for example, four) control terminals. The plurality of control terminals are terminals for inputting control signals from an external circuit (for example, the signal processing circuit 301) to the controller. The controller controls the power amplifiers 11A and 11B based on the control signals obtained from the plurality of control terminals. The plurality of control terminals are, for example, compatible with mobile industry processor interface (MIPI) specifications. As an input part to which a control signal is input, the controller has a plurality of terminals connected to the plurality of control terminals. Further, the controller is not only connected to the power amplifiers 11A and 11B but also connected to the first switch 4 and the second switch 5, and also controls the first switch 4 and the second switch 5 based on the control signals described above.

Figure 5:
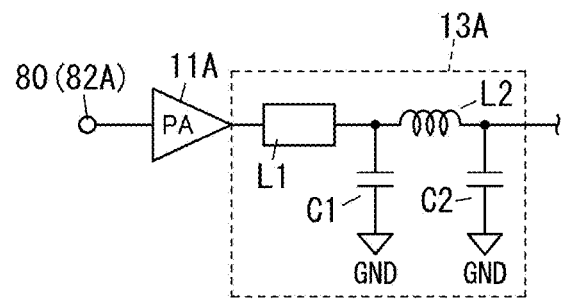
FIG. 5 is a circuit diagram of another example of the output matching circuit of the radio frequency module.

The output, matching circuit 13A is provided between the output terminal of the power amplifier 11A and the common terminal 50 of the second switch 5 on the signal path Tx11. The output matching circuit 13A is a circuit for providing impedance matching between the power amplifier 11A and the transmission filters 12A and 12B. The output matching circuit 13A includes, for example, as illustrated in FIG. 4, a plurality of (in the illustrated example, two) inductor parts L1 and L2 and a plurality of (in the illustrated example, two) capacitors C1 and C2. While the term "inductor parts" is used herein, the devices may equally well be described as inductors. Each of the two inductor parts L1 and L2 has a first end and a second end. Each of the two capacitors C1 and C2 has a first end and a second end. In the output matching circuit 13A, the first end of the inductor part L1 is connected to the output terminal of the power amplifier 11A, and the second end of the inductor part L1 is connected to both the first ends of the capacitors C1 and C2. The second end of the capacitor C1 is connected to the ground. The second end of the capacitor C2 is connected to the first end of the inductor part L2 and the common terminal 50 of the second switch 5. The second end of the inductor part L2 is connected to the ground. The circuit configuration of the output matching circuit 13A is not limited to the example of FIG. 4. The output matching circuit 13A may alternatively be configured, for example, as illustrated in FIG. 5, in such a way that the inductor part L2 is connected in series to the inductor part L1, the second end of the inductor part L1 is connected the ground via the capacitor C1, and the second end of the inductor part L2 is connected to the ground via the capacitor C2.

The output, matching circuit 13B is provided between the output terminal of the power amplifier 11B and the selection terminal 71 of the fourth switch 7 on the signal path Tx12. The output matching circuit 133 is a circuit for providing impedance matching between the power amplifier 11B and the transmission/reception filter 32C. The output matching circuit 13B includes, for example, a plurality of inductor parts and a plurality of capacitors. The circuit configuration of the output matching circuit 13B is the same as that of the output matching circuit 13A. However, the circuit configuration of the output matching circuit 13B is not limited thereto and may have a different circuit configuration.

The low noise amplifier 21A has an input terminal and an output terminal. The low noise amplifier 21A is provided on a signal path Rx11 connected to the signal output terminal 83A. The low noise amplifier 21A amplifies a received signal of the first predetermined frequency band, which is input to the input terminal, and outputs the amplified signal from the output terminal. The input terminal of the low noise amplifier 21A is connected to a common terminal 60 of the third switch 6. The radio frequency module 1 further includes the input matching circuit 23A provided between the input terminal of the low noise amplifier 21 and the common terminal 60 of the third switch 6. The output terminal of the low noise amplifier 21A is connected to the signal output terminal 83A. The output terminal of the low noise amplifier 21A is, for example, connected to the signal processing circuit 301 via the signal output terminal 83A. The signal output terminal 83A is a terminal for outputting a radio frequency signal (received signal) from the low noise amplifier 21A to an external circuit (for example, the signal processing circuit 301).

The low noise amplifier 21B has an input terminal and an output terminal. The low noise amplifier 21B is provided on a signal, path Rx12 connected to the signal output terminal 83B. The low noise amplifier 21B amplifies a received signal of the second predetermined frequency band input to the input terminal and outputs the amplified signal from the output terminal. The input terminal of the low noise amplifier 21B is connected to a selection terminal 72, which is one of two selection terminals 71 and 72 of the fourth switch 7. The radio frequency module 1 further includes the input matching circuit 23B provided between the input terminal of the low noise amplifier 21B and the selection terminal 12 of the fourth switch 7. The output terminal of the low noise amplifier 21B is connected to the signal output terminal 83B. The output terminal of the low noise amplifier 21B is, for example, connected to the signal processing circuit 301 via the signal output terminal 33B. The signal output terminal 83B is a terminal for outputting a radio frequency signal (received signal) from the low noise amplifier 21B to an external circuit (for example, the signal processing circuit 301).

The transmission filter 12A is, for example, a filter whose pass band is a transmission band of the first communication band. The transmission filter 12B is, for example, a filter whose pass band is a transmission band of the second communication band. The transmission/reception filter 32C is, for example, a filter whose pass band is a transmission band and a reception band of the third communication band. The reception filter 22A is, for example, a filter whose pass band is a reception band of the first communication band. The reception filter 22B is, for example, a filter whose pass band is a reception band of the second communication band.

The first switch 4 has a common terminal 40 and a plurality of (here, three) selection terminals 41 to 43. The first switch 4 is an antenna switch connected to the antenna terminal 81. In the first switch 4, the common terminal 40 is connected to the antenna terminal 81. Mere specifically, the common terminal 40 is connected to the antenna terminal 81 via a first filter 30 included in the diplexer 3 that includes this first filter 30 and a second filter 31. The antenna 310 is connected to the antenna terminal 81. The selection terminal 41 is connected to a node of the output terminal of the transmission filter 12A and the input terminal of the reception filter 22A via the matching circuit 14A. The selection terminal 42 is connected to a node of the output terminal of the transmission filter 12B and the input terminal of the reception filter 22B via the matching circuit 14B. The selection terminal 43 is connected to the transmission/reception filter 32C via the matching circuit 14C. The first switch 4 is, for example, a switch that can connect the common terminal 40 to at least one of the plurality of (here, three) selection terminals 41 to 43. Here, the first switch 4 is, for example, a switch that can have one-to-one connection and one-to-many connection.

The first switch 4 is connected to a transmission circuit including the power amplifier 11A, the output matching circuit 13A, the second switch 5, the transmission filter 12A, and the matching circuit 14A. Further, the first switch 4 is connected to a transmission circuit including the power amplifier 11A, the output matching circuit 13A, the second switch 5, and the transmission filter 12B. Further, the first switch 4 is connected to a transmission circuit including the power amplifier 11B, the output matching circuit 13B, the fourth switch 7, the transmission/reception filter 32C, and the matching circuit 14C. Further, the first switch 4 is connected to a reception circuit including the matching circuit 14A, the reception filter 22A, the second switch 5, the input matching circuit 23A, and the low noise amplifier 21A. Further, the first switch 4 is connected to a reception circuit including the matching circuit 14B, the reception filter 22B, the second switch 5, the input matching circuit 23A, and the low noise amplifier 21A. Further, the first switch 4 is connected to a reception circuit including the matching circuit 14C, the transmission/reception filter 32C, the fourth switch 7, the input matching circuit 23B, and the low noise amplifier 21B.

The first switch 4 is, for example, controlled by a controller. For example, the first switch 4 changes the connection state between the common terminal 40 and the plurality of selection terminals 41 to 43 in response to a control signal from the controller. The first switch 4 is, for example, a switch integrated circuit (IC).

The second switch 5 has the common terminal 50 and a plurality of (here, two) selection terminals 51 and 52. The common terminal 50 is connected to the output terminal of the power amplifier 11A via the output matching circuit 13A. The selection terminal 51 is connected to the input terminal of the transmission filter 12A. The selection terminal 52 is connected to the input terminal of the transmission filter 12B. The second switch 5 is, for example, a switch that can connect the common terminal 50 to at least one of the plurality of selection terminals 51 and 52. Here, the second switch 5 is, for example, a switch that can have one-to-one connection and one-to-many connection. The second switch 5 is a band selection switch for switching between a plurality of signal paths for transmitting signals of communication bands different from each other.

The second switch 5 is, for example, controlled by a controller. The second switch 5 changes, for example, the connection state between the common terminal 50 and the plurality of selection terminals 51 and 52 in response to a control signal from the controller. The second switch 5 is, for example, a switch IC.

The third switch 6 includes the common terminal 60 and a plurality of selection terminals 61 and 62. The common terminal 60 is connected to the input terminal of the low noise amplifier 21A. The selection terminal 61 is connected to the output terminal of the reception filter 22A. The selection terminal 62 is connected to the output terminal of the reception filter 22B. The third switch 6 is, for example, a switch that can connect the common terminal 60 to at least one of the plurality of selection terminals 61 and 62. Here, the third switch 6 is, for example, a switch that can have one-to-one connection and one-to-many connection.

The third switch 6 is, for example, controlled by a controller. The third switch 6 changes, for example, the connection state between the common terminal 60 and the plurality of selection terminals 61 and 62 in response to a control signal from the controller. The third switch 6 is, for example, a switch IC.

As described above, the diplexer 3 includes the first filter 30 and the second filter 31. The first filter 30 is, for example, a low pass filter whose pass band is a frequency band including the first predetermined frequency band and the second predetermined frequency band. The second filter 31 is, for example, a high pass filter whose pass band is a frequency band higher than a frequency band that includes the first predetermined frequency band and the second predetermined frequency band.

The input matching circuit 23A is provided on the signal path between the input terminal of the low noise amplifier 21A and the common terminal 60 of the third switch 6. The input matching circuit 23A is a circuit for providing impedance matching between the low noise amplifier 21A and the reception filters 22A and 22B. The input matching circuit 23A is made up of, for example, a single inductor. However, the configuration of the input matching circuit 23A is not limited thereto, and the input matching circuit 23A may include a plurality of inductors and a plurality of capacitors in some cases.

The input matching circuit 23B is provided on the signal path between the input terminal of the low noise amplifier 21B and the selection terminal 72 of the fourth switch 7. The input snatching circuit 23B is a circuit for providing impedance matching between the low noise amplifier 21B and the transmission/reception filter 32C. The input matching circuit 23B is made up of, for example, a single inductor. However, the configuration thereof the input matching circuit 23B is not limited thereto, and the input matching circuit 23B may include a plurality of inductors and a plurality of capacitors in some cases.

The matching circuit 14A is provided between the selection terminal 41 of the first switch 4 and two filters, which are the transmission filter 12A and the reception filter 22A. The matching circuit 14A is a circuit for providing impedance matching between circuit elements, which are the antenna 310 connected to the antenna terminal 81 and the first switch 4, and filters, which are the transmission filter 12A and the reception filter 22A. The matching circuit 14A is made up of, for example, a single inductor. However, the configuration of the matching circuit 14A is not limited thereto, and the matching circuit 14A may include a plurality of inductors and a plurality of capacitors in some cases.

The matching circuit 14B is provided between the first switch 4 and two filters, the transmission filter 12B and the reception filter 22B. The matching circuit 14B is a circuit for providing impedance matching between circuit elements, which are the antenna 310 connected to the antenna terminal 81 and the first switch 4, and filters, which are the transmission filter 12B and the reception filter 22B. The matching circuit 14B is made up of, for example, a single inductor. However, the configuration of the matching circuit 14B is not limited thereto, and the matching circuit 14B may include a plurality of inductors and a plurality of capacitors in some cases.

The matching circuit 14C is provided between the transmission/reception filter 32C and the first switch 4. The matching circuit 14C is a circuit for providing impedance matching between circuit elements, which are the antenna 310 connected to the antenna terminal 81 and the first switch 4, and the transmission/reception filter 32C. The matching circuit 14C is made up of, for example, a single inductor. However, the configuration of the matching circuit 14C is not limited thereto, and the matching circuit 14C may include a plurality of inductors and a plurality of capacitors in some cases.

(1.2) Structure of Radio Frequency Module

Next, a structure of the radio frequency module 1 is described with reference to FIG. 1A, FIG. 1B, FIG. 2, and FIG. 3.

The radio frequency module 1 includes a first wiring board 9, a second wiring board 10, the power amplifier 11A, the output matching circuit 13A, and the external connection terminals 80.

The first wiring board 9 has a first principal surface 91 and a second principal surface 92 that are on opposite sides in a thickness direction D1 of the first wiring board 9. The second wiring board 10 has a third principal surface 101 and a fourth principal surface 102 that are on opposite sides in a thickness direction D2 of the second wiring board 10. The second wiring board 10 is separated from the first wiring board 9 in the thickness direction D1 of the first wiring board 9.

The first wiring board 9 is, for example, a printed wiring board, a low temperature co-fired ceramics (LTCC) board, a high temperature co-fired ceramics (BTCC) board, a resin multilayer board, or the like. In this case, the first wiring board 9 is, for example, a multilayer board including a plurality of dielectric layers and a plurality of conductive layers. The plurality of dielectric layers and the plurality of conductive layers are stacked on top of each other in the thickness direction D1 of the first wiring board 9. Each of the plurality of conductive layers is formed in a predetermined pattern, which is determined for each layer. Each of the plurality of conductive layers includes one or more conductor parts in one plane orthogonal to the thickness direction D1 of the first wiring board 9. The material for each conductive layer is, for example, copper. A plurality of conductive layers include a ground layer. In the radio frequency module 1, a plurality of ground terminals 85 and the ground layer are electrically connected using via conductors or the like, which are included in the first wiring board 9.

The first wiring board 9 may be a wiring structure. The wiring structure is, for example, a multilayer structure. The multilayer structure includes at least one insulating layer and at least one conductive layer. The insulating layer is formed in a predetermined pattern. In the case where a plurality of insulating layers are included, each of the plurality of insulating layers is formed in a predetermined pattern, which is determined for each layer. The conductive layer is formed in a predetermined pattern that is different from the predetermined pattern of the insulating layer. In the case where a plurality of conductive layers are included, each of the plurality of conductive layers is formed in a predetermined pattern, which is determined for each layer. The conductive layer may include one or more redistribution parts. In the wiring structure, of two surfaces on opposites sides of the multilayer structure in the thickness direction, a first surface is the first principal surface 91 of the first wiring board 9, and a second surface is the second principal surface 92 of the first wiring board 9. The wiring structure may be, for example, an interposer. The interposer may be an interposes that uses a silicon substrate or a substrate made up of multiple layers.

The first, principal surface 91 and the second principal surface 92 of the first wiring beard 9 are separated from each other in the thickness direction D1 of the first wiring board 9 and cross the thickness direction D1 of the first wiring board 9. Although the first principal surface 91 of the first wiring board 9 is, for example, orthogonal to the thickness direction D1 of the first wiring board 9, the first principal surface 91 may include, for example, a side surface of a conductor part or the like as a surface that is not orthogonal to the thickness direction D1. Further, although the second principal surface 92 of the first wiring board 9 is, for example, orthogonal to the thickness direction D1 of the first wiring board 9, the second principal surface 92 may include, for example, a side surface of a conductor part or the like as a surface that is not orthogonal to the thickness direction D1. Further, micro-asperities, dips, or bumps way be formed on the first principal surface 91 and the second principal surface 92 of the first wiring board 9. In plan view seen from the thickness direction D1 of the first wiring board 9, the first wiring board 9 has a non-square rectangular shape. However, the shape of the first wiring board 9 is not limited thereto and may alternatively be, for example, a square.

The second wiring board 10 is, for example, a printed wiring board, an LTCC board, an HTCC board, or a resin multilayer board. In this case, the second wiring board 10 is, for example, a multilayer board including a plurality of dielectric layers and a plurality of conductive layers. The plurality of dielectric layers and the plurality of conductive layers are stacked on top of each other in the thickness direction D2 of the second wiring board 30. Each of the plurality of conductive layers is formed in a predetermined pattern, which is determined for each layer. Each of the plurality of conductive layers includes one or more conductor parts in a plane orthogonal to the thickness direction D2 of the second wiring board 10. The material for each conductive layer is, for example, copper. The plurality of conductive layers include a ground layer. In the radio frequency module 1, a plurality of ground terminals 85 and the ground layer are electrically connected using via conductors or the like included in the second wiring board 10.

The second wiring board 10 may be a wiring structure. The wiring structure may be, for example, a multilayer structure. The multilayer structure includes at least one insulating layer and at least one conductive layer. The insulating layer is formed in a predetermined pattern. In the case where a plurality of insulating layers are included, each of the plurality of insulating layers is formed in a predetermined pattern, which is determined for each layer. The conductive layer is formed in a predetermined pattern that is different from the predetermined pattern of the insulating layer. In the case where a plurality of conductive layers are included, each of the plurality of conductive layers is formed in a predetermined pattern, which is determined for each layer. The conductive layer may include one or more redistribution parts. In the wiring structure, of two surfaces facing each other in the thickness direction of the multilayer structure, a first surface is the third principal surface 101 of the second wiring board 10, and a second surface is the fourth principal surface 102 of the second wiring board 10. The wiring structure may be, for example, an interposer. The interposer may be an interposer that uses a silicon substrate or a substrate made up of multiple layers.

The third principal surface 101 and the fourth principal surface 102 of the second wiring board 10 are separated from each other in the thickness direction D2 of the second wiring board 10 and cross the thickness direction D2 of the second wiring board 10. Although the third principal surface 101 of the second wiring board 10 is, for example, orthogonal to the thickness direction D2 of the second wiring board 10, the third principal surface 101 may include, for example, a side surface of a conductor part or the like as a surface that is not orthogonal to the thickness direction D2. Further, although the fourth principal surface 102 of the second wiring board 10 is, for example, orthogonal to the thickness direction D2 of the second wiring board 10, the fourth principal surface 102 may include, for example, a side surface of a conductor part or the like as a surface that is not orthogonal to the thickness direction D2. Further, microasperities, dips, or bumps may be formed on the third principal surface 101 and the fourth principal surface 102 of the second wiring board 10. In plan view seen from the thickness direction D2 of the second wiring board 10, the shape of outer perimeter of the second wiring board 10 is the same as the shape of outer perimeter of the first wiring board 9. However, the shape of outer perimeter of the second wiring board 10 is not limited thereto and may have a different shape.

The radio frequency module 1 includes, as a plurality of circuit element parts, two power amplifiers 11A and 11B, the plurality of inductor parts L1 and L2 and the plurality of capacitors C1 and C2 of the output matching circuit 13A, the plurality of inductor parts and the plurality of capacitors of the output matching circuit 13B, two low noise amplifiers 21A and 21B, two transmission filters 12A and 12B, two reception filters 22A and 22B, the transmission/reception filter 32C, the first switch 4, the second switch 5, the third switch 6, the fourth switch 7, the inductor of the input matching circuit 23A, the inductor of the input matching circuit 23B, the inductor of the matching circuit 14A, the inductor of the matching circuit 14B, the inductor of the matching circuit 14C, the diplexer 3, and the controller, which are described above.

The power amplifier 11A, the plurality of inductor parts L1 and L2 of the output snatching circuit 13A, and the plurality of capacitors C1 and C2 of the output matching circuit 13A are arranged on the first principal surface 91 of the first wiring board 9. The power amplifier 11A is, for example, a GaAs-based IC clip that includes a power amplifier circuit including a heterojunction bipolar transistor (HBT). The power amplifier circuit includes an output-stage amplifier circuit and a drive-stage amplifier circuit. The power amplifier 11A is not limited to the GaAs-based IC chip and may alternatively be, for example, a Si-based 1C chip including a power amplifier circuit or a SiGe-based IC chip including a power amplifier circuit. In plan view seen from the thickness direction D1 of the first wiring board 9, the shape of outer perimeter of the power amplifier 11A is a rectangle. Of the plurality of inductor parts L1 and L2 of the output matching circuit 13A, the first inductor part L1, which is the inductor part closest to the output pad electrode 112A of the power amplifier 11A, is a line inductor 95 and is arranged on the first principal surface 91 of the first wiring board 9. In this case, the line inductor 95 is formed by using part of the conductive layer that is the top surface layer of the plurality of conductive layers of the first wiring board 9. Further, the inductor part L2 is a chip inductor and is mounted on the first wiring board 9. The inductor part L2 is not limited to a chip inductor and may alternatively be a line inductor. The plurality of capacitors C1 and C2 are surface-mounted electronic components and are mounted on the first wiring board 9. Here, the term "be mounted" includes the case where a circuit element part is arranged on (mechanically connected to) the first wiring board 9 and the case where a circuit element part is electrically connected to (an appropriate conductor part of) the first, wiring beard 5.

Further, on the first principal surface 91 of the first wiring board 9, the power amplifier 11B and the plurality of inductor parts and the plurality of capacitors of the output matching circuit 13B are further arranged. As with the power amplifier 11A, the power amplifier 11B is a GaAs-based IC chip including a power amplifier circuit. However, the power amplifier 11B may alternatively be a Si-based IC chip including a power amplifier circuit or a SiGe-based IC chip including a power amplifier circuit. Of the plurality of inductor parts of the output matching circuit 13B, a first inductor part, which is the inductor part closest to the output, pad electrode of the power amplifier 11B, is a line inductor and is arranged on the first principal surface 91 of the first wiring board 9. The plurality of capacitors of the output matching circuit 133 are surface-mounted electronic components and are mounted on the first wiring board 9.

The second switch 5 and the transmission filters 12A and 12B are further arranged on the first principal surface 91 of the first wiring board 9. In this case, the second switch 5 and the transmission filters 12A and 12B are mounted on the first principal surface 91 of the first wiring board 9. More specifically, the second switch 5 and the transmission filters 12A and 12B are flip-chip mounted on the first principal surface 51 of the first wiring board 5. Each of these two transmission filters 12A and 12B is, for example, a ladder filter and has a plurality of (for example, four) series arm resonators and a plurality of (for example, three) parallel arm resonators. Each of these two transmission filters 12A and 12B is, for example, an acoustic wave filter, and each of the plurality of series arm resonators and the plurality of parallel arm resonators is made up of an acoustic wave resonator. The acoustic wave filter is, for example, a surface acoustic wave filter that uses a surface acoustic wave. In the surface acoustic wave filter, each of the plurality of series arm resonators and the plurality of parallel arm resonators is, for example, a surface acoustic wave (SAW) resonator.

The first switch 4, the reception filters 22A and 22B, the transmission/reception filter 32C, the diplexer 3, and the controller are arranged on the second principal surface 92 of the first wiring board 9. In this case, the first switch 4, the reception filters 22A and 228, the transmission/reception filter 32C, and the controller are mounted on the second principal surface 92 of the first wiring board 9. More specifically, the first switch 4, the reception filters 22A and 22B, and the transmission/reception filter 32C are flip-chip mounted on the second principal surface 92 of the first wiring board 9. Each of these two reception filters 22A and 22B is, for example, a ladder filter and has a plurality of (for example four) series arm resonators and a plurality of (for example, three) parallel arm resonators. Each of these two reception filters 22A and 22B is, for example, an acoustic wave filter and each of the plurality of series arm resonators and the plurality of parallel arm resonators is made up of an acoustic wave resonator. The acoustic wave filter is, for example, a surface acoustic wave filter that uses a surface acoustic wave. In the surface acoustic wave filter, each of the plurality of series arm resonators and the plurality of parallel arm resonators is, for example, a SAW resonator. Each of the first filter 30 and the second filter 31 of the diplexer 3 includes, for example, a plurality of inductors and a plurality of capacitors. The first filter 30 and the second filter 31 of the diplexer 3 include a plurality of inductors and a plurality of capacitors. The first filter 30 and the second filter 31 may be an integrated passive device (IPO). The controller is an IC chip having at least capability of controlling the power amplifiers 11A and 11B. The controller is circuitry that may be in the form of a fixed circuit (e.g., application specific integrate circuit) or a programmable device (e.g., CPU) that is configured by software to perform the control function.

For example, the transmission/reception filter 320 and the fourth switch 7 are arranged on the fourth principal surface 102 of the second wiring board 10. The transmission/reception filter 32C is, for example, a ladder filter and has a plurality of (for example, four) series arm resonators and a plurality of (for example, three) parallel arm resonators. The transmission/reception filter 32C is, for example, an acoustic wave filter, and each of the plurality of series arm resonators and the plurality of parallel arm resonators is made up of an acoustic wave resonator. The acoustic wave filter is, for example, a surface acoustic wave filter that uses a surface acoustic wave. In the surface acoustic wave filter, each of the plurality of series arm resonators and the plurality of parallel arm resonators is, for example, a SAW resonator.

Further, on the fourth principal surface 102 of the second wiring board 10, two low noise amplifiers 21A and 21B, the third switch 6, the inductor or the input matching circuit 23A, the inductor of the input matching circuit 23B, and the plurality of the external connection terminals 80 are arranged. In this case, these two low noise amplifiers 21A and 21B are each a Si-based IC chip including an amplifier circuit. In the radio frequency module 1, the low noise amplifier 21A and the low noise amplifier 21B may be integrated into a single chip. Further, in the radio frequency module 1, the low noise amplifier 21A, the low noise amplifier 21B, and the third switch 6 may be integrated into a single chip.

The inductor in each of the two input matching circuits 23A and 23B is, for example, a chip inductor. The inductor in each of the two input matching circuits 23A and 23B is, for example, mounted on the fourth principal surface 102 of the second wiring board 10. However, the place to be mounted is not limited thereto.

The inductor in each of the plurality of matching circuits 14A, 14B, and 14C is, for example, a chip inductor. The inductor in each of the plurality of matching circuits 14A, 14B, and 14C is, for example, mounted on the second principal surface 92 of the first wiring board 9. However, the place to be mounted is not limited thereto.

The plurality of external connection terminals 80 are arranged on the fourth principal surface 102 of the second wiring board 10. The material for the plurality of external connection terminals 80 is, for example, copper or copper alloy. Each of the plurality of external connection terminals 80 is a pillar electrode. In this case, the pillar electrode is, for example, a cylindrical electrode.

The plurality of external connection terminals 80 include, as described above, the antenna terminal 81, two signal input terminals 82A and 82B, two signal, output terminals 83A and 83B, the plurality of control terminals, and the plurality of ground terminals 85. As described above, the plurality of ground terminals 85 are electrically connected to at least one of the ground layer of the first, wiring board 9 and the ground layer of the second wiring board 10. The ground layer is a circuit ground of the radio frequency module 1, and the plurality of circuit element parts of the radio frequency module 1 include a circuit element part electrically connected to the ground layer.

The radio frequency module 1 further includes a first resin layer 16. The first resin layer 16 covers a plurality of circuit element parts (two power amplifiers 11A and 11B, two inductor parts L1 and L2, two capacitors C1 and C2, the second switch 5, two transmission filters 12A and 12B, and the like) arranged on the first principal surface 51 of the first wiring board 9 on the first principal surface 51 side of the first wiring board 9. The first resin layer 16 includes a resin. The first resin layer 16 may include a filler in addition to the resin.

Further, the radio frequency module 1 further includes a second resin layer 17. The second resin layer 17 covers, on the fourth principal surface 102 side of the second wiring board 10, a plurality of circuit element parts (two low noise amplifier 21A and 213 and the like) and part of each of the plurality of external connection terminals 80 arranged on the fourth principal surface 102 of the second wiring board 10. The second resin layer 17 is formed in such a manner as to expose a top-end face of each of the plurality of external connection terminals 80. The second resin layer 17 includes a resin. The second resin layer 17 may include a filler in addition to the resin. The material for the second resin layer 17 may foe the same as or different from the material for the first resin layer 16. The second resin layer 17 may alternatively be formed in such a manner as to expose a principal surface on the side opposite the second wiring board 10 side in each of the plurality of circuit element parts arranged on the fourth principal surface 102 of the second wiring board 10.

Further, the radio frequency module 1 further includes a third resin layer 18. The third resin layer 18 covers a plurality of circuit element parts (the first switch 4, the reception filters 22A and 22B, the transmission/reception filter 32C, the diplexer 3, the controller, and the like) arranged on the second principal surface 92 of the first wiring board 5 on the second principal surface 92 side of the first wiring board 9. The third resin layer 18 includes a resin. The third resin layer 18 may include a filler in addition to the resin. The material for the third resin layer 18 may be the same as or different from the material for the first resin layer 16. The third resin layer 18 is interposed between the second principal surface 92 of the first wiring board 9 and the third principal surface 101 of the second wiring board 10. In the radio frequency module 1 for example, the third resin layer 18 and the third principal surface 101 of the second wiring board 10 are joined together (for example, thermocompression bonded).

Further, the radio frequency module 1 further includes a penetration electrode 94. The penetration electrode 94 overlaps the power amplifier 11A in plan view seen from the thickness direction D1 of the first wiring board 9. The penetration electrode 94 is connected to the power amplifier 11A and penetrates through the first wiring beard 9 and the second wiring board 10. The penetration electrode 94 includes a conductor part 941 penetrating through the first wiring board 9, a conductor part 942 penetrating through the third resin layer 18, and a conductor part 943 penetrating through the second wiring board 10. The penetration electrode 94 connects the power amplifier 11A and a heat dissipation terminal 86, which is included in the plurality of external connection terminals 80. The heat dissipation terminal 86 is connected to the ground of the circuit board 320. It is preferable that the radio frequency module 1 includes a plurality of penetration electrodes 94 connected to the power amplifier 11A.

(2) Summary (2.1) Radio Frequency Module

The radio frequency module 1 according to the first embodiment includes the first wiring board 9, the second wiring board 10, the power amplifier 11A, the output matching circuit 13A, and the external connection terminals 80. The first wiring board 9 has the first, principal surface 91 and the second principal surface 92 that face each other. The second wiring board 10 has the third principal surface 101 and the fourth principal surface 102 that face each other. The second wiring board 10 is separated from the first wiring board 9 in the thickness direction D1 of the first wiring board 9. The power amplifier 11A has the output pad electrode 112A. The output matching circuit 13A includes the plurality of inductor parts L1 and L2 and is connected to the output pad electrode 112A of the power amplifier 11A. In the radio frequency module 1, the second principal surface 92 of the first wiring board 9 and the third principal surface 101 of the second wiring board 10 face each other. The external connection terminals 80 are arranged on the fourth principal surface 102 of the second wiring board 10. The power amplifier 11A is arranged on the first principal surface 91 of the first wiring board 9. In the output matching circuit 13A, the first inductor part, which is the inductor part L1 closest to the output pad electrode 112A of the plurality of inductor parts L1 and L2, is arranged on the first principal surface 91 of the first wiring board 9.

The radio frequency module 1 according to the first embodiment can improve the Q factor of the inductor part L1 included in the output matching circuit 13A connected to the power amplifier 11A. The Q factor, or "quality factor", is a ratio of initial energy stored in a resonator to the energy lost in one radian of the cycle of oscillation. Thus, a higher Q factor means that an oscillation dies out more slowly in the resonator than a resonator with a lower Q factor. In the radio frequency module 1 according to the first embodiment, of the plurality of inductor parts L1 and L2 in the output matching circuit 13A, the first inductor part, which is the inductor part L1 closest to the output pad electrode 112A, is arranged on the first principal surface 91 of the first wiring board 9. This can reduce the parasitic capacitance formed between the inductor part L1 and the ground of the circuit, board 320 or the like and improve the Q factor of the inductor part L1.

In the radio frequency module 1 according to the first embodiment, the entirety of the first inductor part, which is the inductor part L1 closest to the output pad electrode 112A of the plurality of inductor parts L1 and L2, is arranged on the first principal, surface 91 of the first wiring board 9. However, the arrangement of the first inductor part is not limited thereto, and alternatively, at least part of the first inductor part may be arranged on the first principal surface 91 of the first wiring board 9. Here, it becomes possible to improve the Q factor of the first inductor part in the case where the entirety of the first inductor part is arranged on the first principal surface 91 of the first wiring board 9, compared with the case where part of the first inductor part is arranged on the first principal surface 91 of the first wiring board 9 and the remaining of the first inductor part is arranged in the inside of the first wiring board 9.

In the radio frequency module 1, also in the output matching circuit 13B connected to the power amplifier 11B, of the plurality of inductor parts in the output matching circuit 13B, the first inductor part, which is the inductor part closest, to the output pad electrode, is arranged on the first principal surface 91 of the first wiring board 9. Because of this, the radio frequency module 1 according to the first embodiment can improve the Q factor of the first inductor part included in the output matching circuit 13B connected to the power amplifier 11B.

The radio frequency module 1 according to the first embodiment includes the first wiring board 9 and the second wiring board 10, and the first wiring board 9 and the second wiring board 10 are separated from each other in the thickness direction D1 of the first wiring board 9. This can improve flexibility in arrangement of a plurality of circuit element parts while achieving size reduction of the radio frequency module 1 in plan view seers from the thickness direction D1 of the first wiring board 9.

Further, in the radio frequency module 1 according to the first embodiment, the first inductor part (inductor part L1) is the line inductor 95. This can reduce the profile height in the radio frequency module 1 according to the first embodiment.

Further, the radio frequency module 1 according to the first embodiment further includes the penetration electrode 94. The penetration electrode 94 overlaps the power amplifier 11A in plan view seen from the thickness direction D1 of the first wiring board 9. The penetration electrode 94 is connected to the power amplifier 11A and penetrates through the first wiring board 9 and the second wiring board 10. This can improve the heat dissipating ability in the radio frequency module 1 according to the first embodiment.

Further, in the radio frequency module 1 according to the first embodiment, no circuit element part that overlaps the power amplifier 11 in plan view seen from the thickness direction D1 is arranged on the second principal surface 92 of the first wiring board 9, the third principal surface 101 of the second wiring board 10, and the fourth principal surface 102 of the second wiring board 10. Because of this, in the radio frequency module 1 according to the first embodiment, the advantageous effect of facilitating dissipation of heat generated in the power amplifier 11, the characteristics of a circuit element part arranged on any one of the second principal surface 92 of the first wiring board 9, the third principal surface 101 of the second wiring board 10, and the fourth principal surface 102 of the second wising board 10 is less likely to receive thermal influence from the power amplifier 11.

Further, the radio frequency module 1 according to the first embodiment further includes the low noise amplifiers 21A and 21B. The low noise amplifiers 21A and 21B are arranged on the second wiring board 10. This enables the radio frequency module 1 according to the first embodiment to be used for transmitting a transmission signal and receiving a reception signal and improve the isolation between the power amplifier 11A and the low noise amplifiers 21A and 21B.

(2.2) Communication Device

The communication device 300 according to the first embodiment includes the radio frequency module 1 and the signal processing circuit 301. The signal processing circuit 301 performs signal processing on a transmitting signal. The radio frequency module 1 amplifies and outputs a transmitting signal from the signal processing circuit 301. The radio frequency module 1 transmits the transmitting signal between the antenna 310 and the signal processing circuit 301.

Because the communication device 300 according to the first embodiment includes the radio frequency module 1, it becomes possible to improve the Q factor of the inductor part L1 included in the output matching circuit 13A connected to the power amplifier 11A. A plurality of electronic components that constitute the signal processing circuit 301 may be mounted, for example, on the circuit board 320 described above or on another circuit board (second circuit board) separated from a first circuit board that is the circuit board 320 on which the radio frequency module 1 is mounted.

(3) Modifications of Radio Frequency Module (3.1) First Modification

Figure 6:
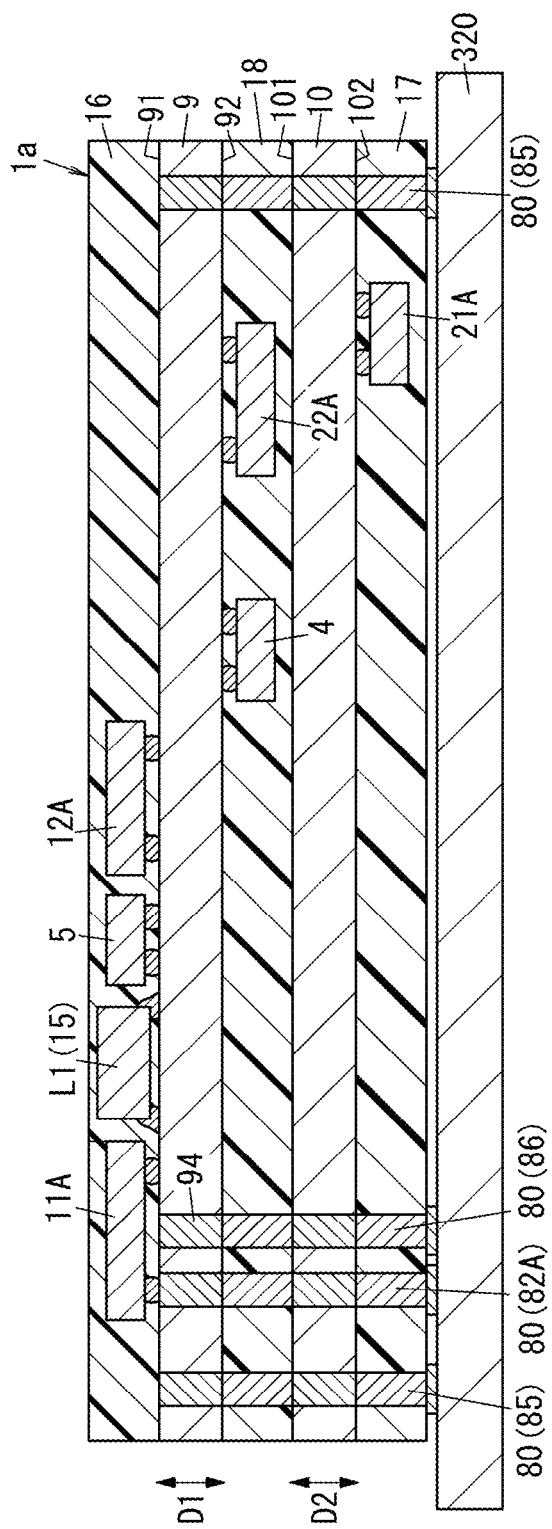
FIG. 6 is a sectional diagram of a radio frequency module according to a first modification of the first embodiment.

A radio frequency module La according to a first modification of the first embodiment is described with reference to FIG. 6. With regard to the radio frequency module 1a according to the first modification, the same reference numerals denote constituent elements similar to those of the radio frequency module 1 according to the first embodiment, and the descriptions thereof are omitted.

The radio frequency module 1a according to the first modification is different from the radio frequency module 1 according to the first embodiment in that the inductor part L1 of the output matching circuit 13A is a chip inductor 15.

The radio frequency module 1a according to the first modification can further improve the Q factor of the inductor part L1 included in the output matching circuit 13A (see FIG. 4) connected to the power amplifier 11A.

(3.2) Second Modification

Figure 7:
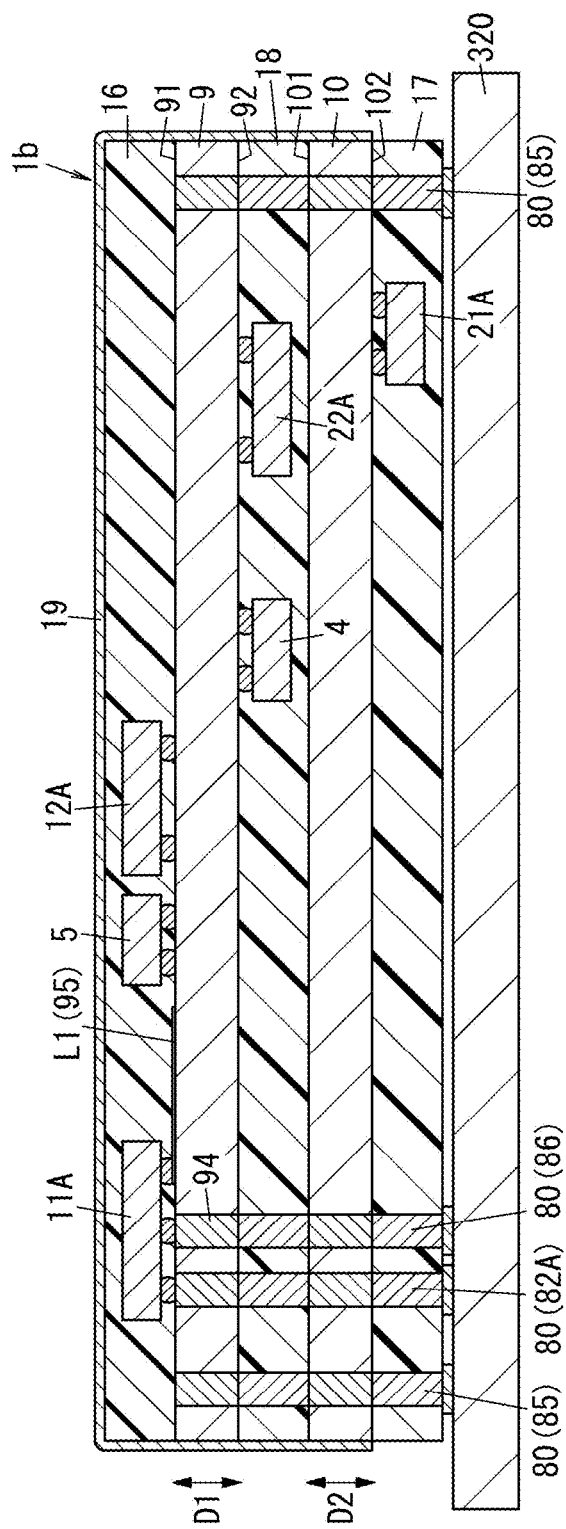
FIG. 7 is a sectional diagram of a radio frequency module according to a second modification of the first embodiment.

A radio frequency module 1b according to a second modification of the first embodiment is described with reference to FIG. 7. With regard to the radio frequency module 1b according to the second modification, the same reference numerals denote constituent elements similar to those of the radio frequency module 1 according to the first embodiment, and the descriptions thereof are omitted.

The radio frequency module 1b according to the second modification is different from the radio frequency module 1 according to the first embodiment in further including a shield layer 19.

The material for the shield layer 19 is, for example, a metal. The shield layer 19 covers a principal surface and outer periphery surfaces of the first resin layer 16, outer periphery surfaces of the first wiring board 9, outer periphery surfaces of the third resin layer 18, and outer periphery surfaces of the second wiring board 10. The shield layer 19 is in contact with the ground layer included in the first wiring board 9 and the ground layer included in the second wiring board 10. This enables the electrical potential of the shield layer 19 to be substantially equal to the electric potential of each ground layer. In the radio frequency module 1b according to the second modification, it becomes possible to suppress the radiation noise from a transmission circuit including the power amplifier 11A and the output matching circuit 13A to the outside of the radio frequency nodule 1b and hinder the entrance of noise such as electromagnetic waves or the like from the outside of the radio frequency module 1b.

(3.3) Third Modification

Figure 8:
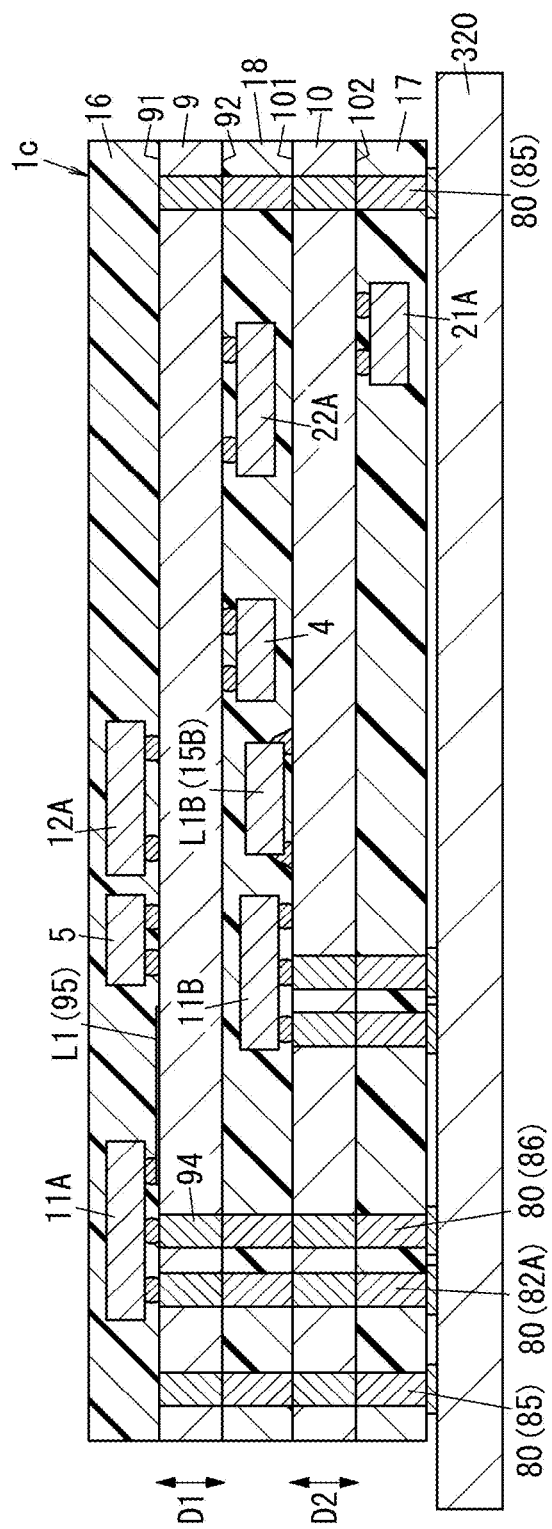
FIG. 8 is a sectional diagram of a radio frequency module according to a third modification of the first embodiment.

A radio frequency module 1c according to a third modification of the first embodiment is described with reference to FIG. 8. With regard to the radio frequency module 1c according to the eighth modification, the same reference numerals denote constituent elements similar to those of the radio frequency module 1 according to the first embodiment, and the descriptions thereof are omitted.

The radio frequency module 1c according to the third modification is different from the radio frequency module 1 according to the first embodiment in that the power amplifier 11B is arranged on the third principal surface 101 of the second wiring board 10.

Further, the radio frequency module 1c according to the third modification is different from the radio frequency module 1 according to the first embodiment in that in the output matching circuit 13B (see FIG. 4), an inductor part LIB that is closest to the output electrode pad of the power amplifier 11B is a chip inductor 15B.

In the radio frequency module 1c according to the third modification, it becomes possible to employ the chip inductor 15B, which has a higher Q factor compared with a line inductor, as the inductor part L1B included in the output matching circuit 13B (see FIG. 4) which is connected to the power amplifier 11B.

(3.4) Fourth Modification

Figure 9:
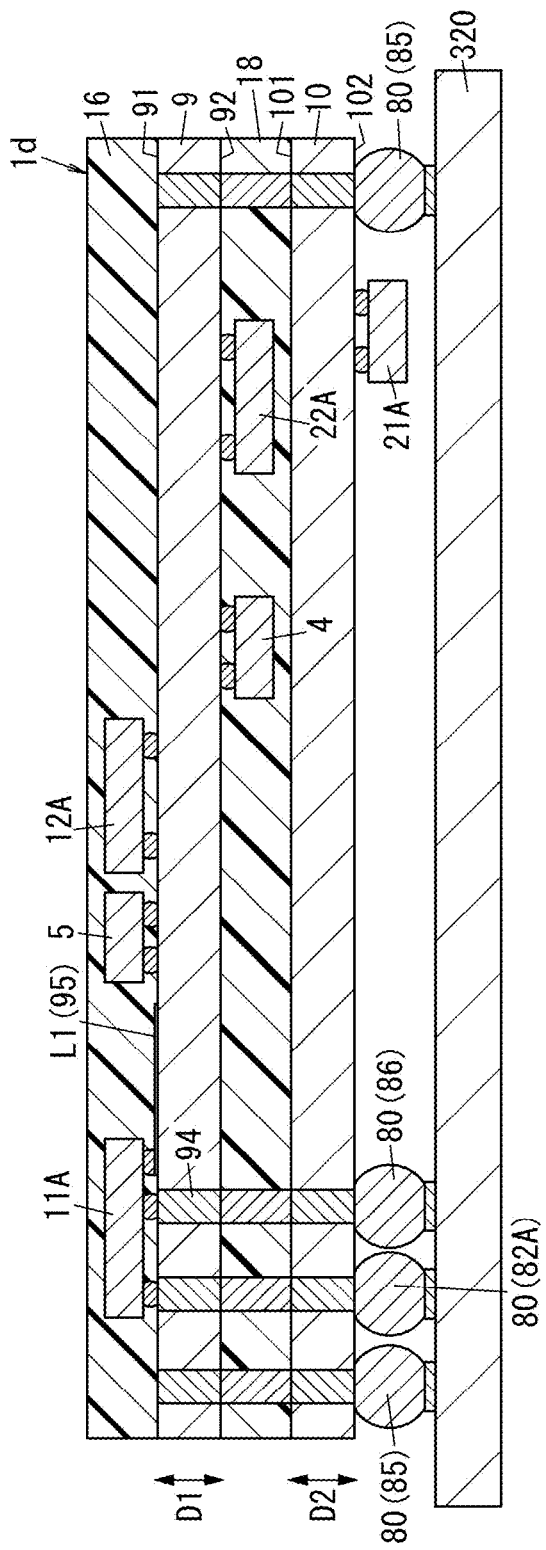
FIG. 9 is a sectional diagram of a radio frequency module according to a fourth modification of the first embodiment.

A radio frequency module 1d according to a fourth modification of the first embodiment is described with reference to FIG. 9. With regard to the radio frequency module 1d according to the fourth modification, the same reference numerals denote constituent elements similar to those of the radio frequency module 1 according to the first embodiment, and the descriptions thereof are omitted.

The radio frequency module 1d according to the fourth modification is different from the radio frequency module 1 according to the first embodiment in that a plurality of external connection terminals 30 are ball bumps. Further, the radio frequency module 1*d* according to the fourth modification is different from the radio frequency module 1 according to the first embodiment in not including the second resin layer 17 of the radio frequency module 1 according to the first embodiment. The radio frequency module 1*d* according to the fourth modification may include an underfill part provided between each of the circuit element parts (two low noise amplifiers 21A and 21B and the like) arranged on the fourth principal surface 102 of the second wiring board 10 and the fourth principal surface 102 of the second wiring board 10.

The material for the ball bump that forms each of the plurality of external connection terminals 80 is, for example, gold, copper, or solder.

The plurality of external connection terminals 80 may include both the external connection terminal 80 made up of a ball bump and the external connection terminal 80 made up of a pillar electrode.

Second Embodiment

A radio frequency module 1*e* and a communication device 300*e* according to a second embodiment, are described with reference to FIGS. 10A, 10B, and 11 to 14. With regard to the radio frequency module 1*e* and the communication device 300*e* according to the second embodiment, the same reference numerals denote constituent elements similar to those of the radio frequency module 1 and toe communication device 300 according to the first embodiment, and the descriptions thereof are omitted.

Figure 13:
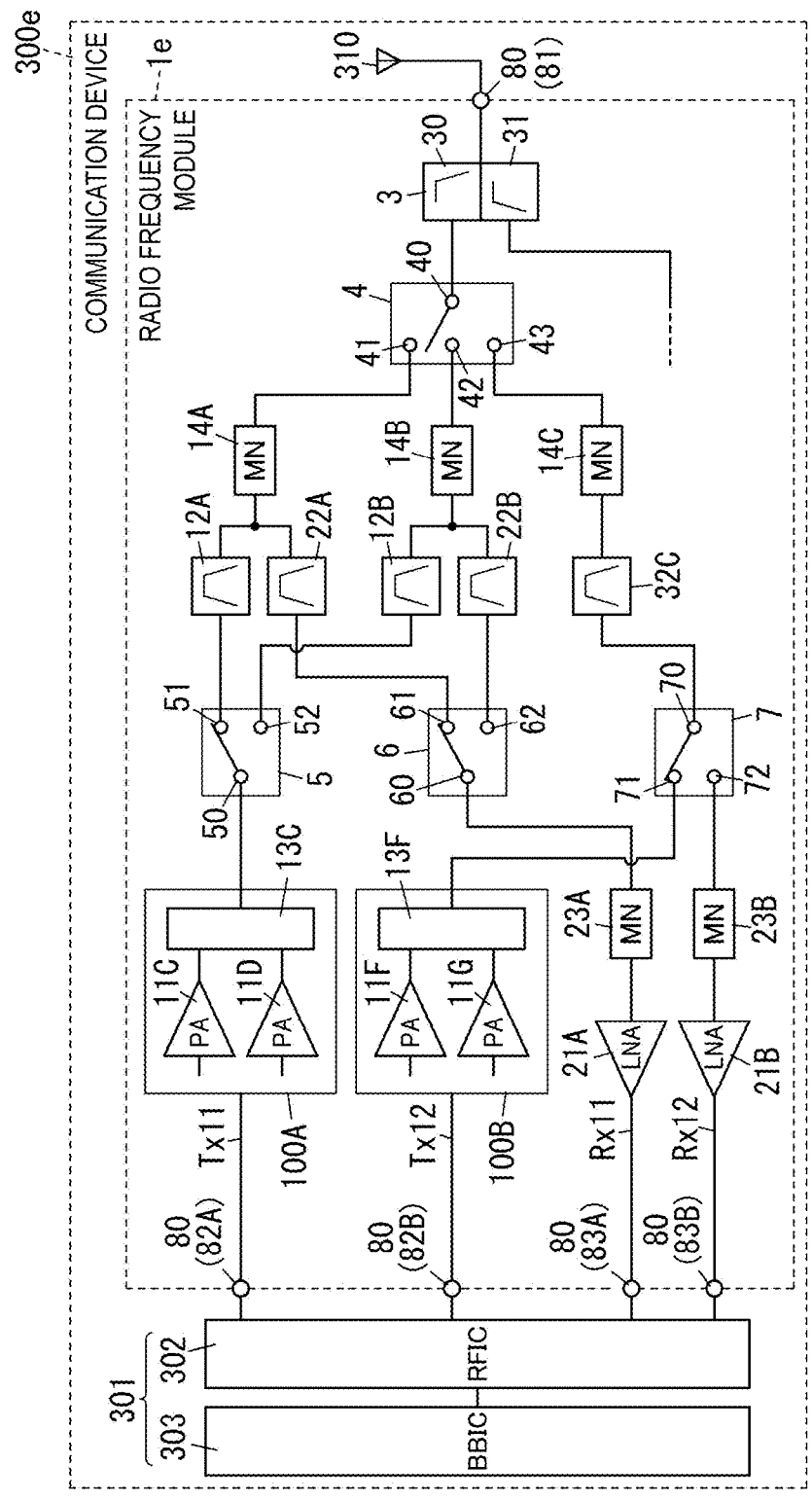
FIG. 13 is a circuit configuration diagram of a communication device including the radio frequency module.
Figure 14:
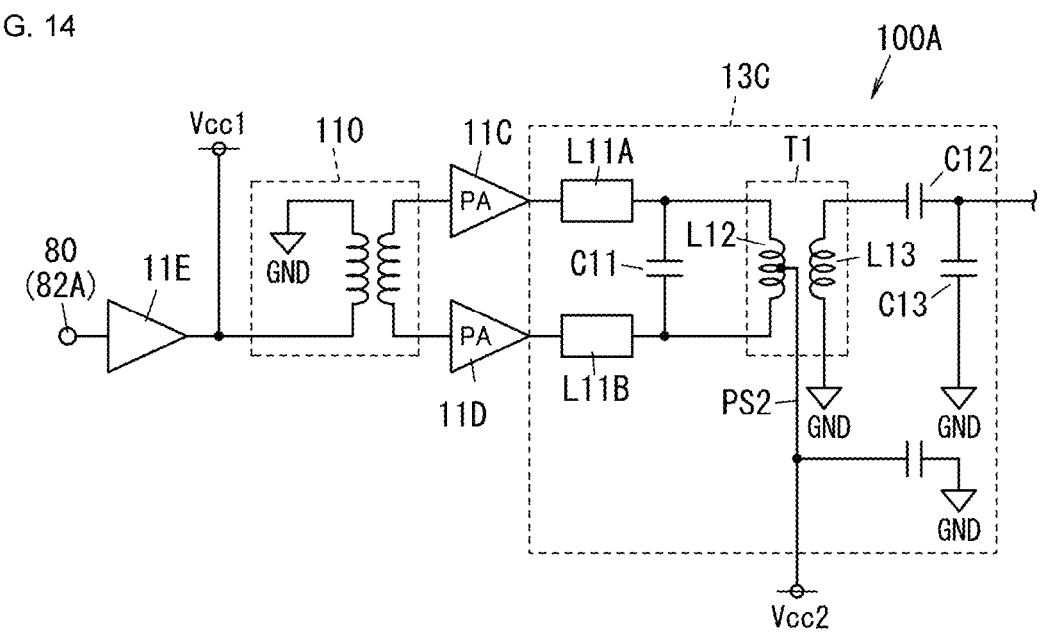
FIG. 14 is a circuit diagram of a relevant part of the radio frequency module.

First, circuit configurations of the radio frequency module 1*e* and the communication device 300*e* according to the second embodiment are described with reference to FIG. 13 and FIG. 14.

The radio frequency module 1*e* according to the second embodiment is different from, the radio frequency module 1 according to the first embodiment in that a differential amplifier circuit 100A is included instead of the power amplifier 11A and the output matching circuit 13A of the radio frequency module 1 according to the first embodiment and that, a differential amplifier circuit 100B is included instead of the power amplifier 11B and the output matching circuit 13B.

The differential amplifier circuit 100A includes a power amplifier 11C (hereinafter, also referred to as first power amplifier 11C), a power amplifier 11D (hereinafter, also referred to as second power amplifier 11D), and an unbalanced-to-balanced transformer circuit 110. The first power amplifier 11C has an input pad electrode 111C and an output pad electrode 112C (see FIG. 10B and FIG. 11). The second power amplifier 11D has an input pad electrode and an output pad electrode 112D (see FIG. 11).

The unbalanced-to-balanced transformer circuit 110 has an unbalanced terminal, a first balanced terminal, and a second balanced terminal. The unbalanced-to-balanced transformer circuit 110 is a balun. In the radio frequency module 1*e*, the first balanced terminal of the unbalanced-to-balanced transformer circuit 110 is connected to the first power amplifier 11C, and the second balanced terminal of the unbalanced-to-balanced transformer circuit 110 is connected to the second power amplifier 11D.

The differential amplifier circuit 100A further includes an amplifying element 11E. The amplifying element 11E has an input terminal and an output terminal. The input terminal of the amplifying element 11E is connected to the signal input terminal 82A. Thy output terminal of the amplifying element 11E is connected to the unbalanced terminal of the unbalanced-to-balanced transformer circuit 110. The first balanced terminal of the unbalanced-to-balanced transformer circuit 110 is connected to the input terminal of the first power amplifier 11C. The second balanced terminal of the unbalanced-to-balanced transformer circuit 110 is connected to the input terminal of the second power amplifier 11D. A bias voltage Vcc1 is applied to the output terminal of the amplifying element 11E.

An output matching circuit 13C includes a plurality of inductor parts L11A, L11B, L12, and L13. Further, the output matching circuit 13C includes a plurality of capacitors C11, C12, and C13.

Each of the plurality of inductor parts L11A, L11B, L12, and L13 has a first end and a second end. Each of the plurality of capacitors C11, C12, and C13 has a first end and a second end.

The first end of the inductor part L11A is connected to the output terminal (output pad electrode 112C) of the power amplifier 11C. The first end of the inductor part L11B is connected to the output terminal (output pad electrode 112D) of the power amplifier 11D.

The inductor part L12 is connected between the second end of the inductor part L11A and the second end of the inductor part L11B. Further, the capacitor C11 is connected between the second end of the inductor part L11A and the second end of the inductor part L11B. That is to say, the capacitor C11 is connected in parallel to the inductor part L12.

The first end of the inductor part L13 is connected to the first end of the capacitor C12. The second end of the inductor part L13 is connected to the ground. The second end of the capacitor C12 is connected to the common terminal 50 of the second switch 5 and the first end of the capacitor C13. The second end of the capacitor C13 is connected to the ground.

The output matching circuit 13C includes a transformer T1 in which a primary coil is the inductor part L12 and a secondary coil is the inductor part L13. That is to say, the radio frequency module 1*e* includes the differential amplifier circuit 100A including the first power amplifier 11C, the second power amplifier 11D, and the transformer T1.

The transformer T1 includes the primary coil (inductor part L12) having a first end and a second end and the secondary coil (inductor part L13) having a first end and a second end. The first end of the primary coil (inductor part L12) is connected to the output terminal of the first power amplifier 11C via the inductor part L11A, and the second end of the primary coil (inductor part L12) is connected to the output terminal of the second power amplifier 11D via the inductor part L11B. Further, a power line PS2 for supplying a bias voltage Vcc2 from the outside of the radio frequency module 1*e* is connected to a midpoint of the primary coil. The first end of the secondary coil (inductor part L13) is connected to the common terminal 50 of the second switch 5 via the capacitor C12. The second end of the secondary coil is connected to the ground (ground terminal 85).

In the differential amplifier circuit 100A, a radio frequency signal input from the signal input terminal 82A is amplified by the amplifying element 11E. The radio frequency signal amplified by the amplifying element 11E is subjected to an unbalanced-to-balanced conversion performed by the unbalanced-to-balanced transformer circuit 110. At this time, a non-inverted input signal is output from the first balanced terminal of the unbalanced-to-balanced transformer circuit 110, and an inverted input signal is output from the second balanced terminal of the unbalanced-to-balanced transformer circuit 110.

A non-inverted input signal amplified by the first power amplifier 11C and an inverted input signal amplified by the second power amplifier 11D are subjected to an impedance conversion performed by the inductors L11A and L11B, the transformer T1, and the capacitor C11 while keeping their opposite phases. This provides impedance matching between the output impedance of the differential amplifier circuit 100A and the input impedance of the second switch 5 and the transmission filters 12A and 12B using the inductors L11A and L11B, the transformer T1, and the capacitor C11. In the output matching circuit 13C of the differential amplifier circuit 100A, the capacitors C12 and C13 also contribute to the foregoing impedance matching.

In the differential amplifier circuit 100A, the first power amplifier 11C and the second power amplifier 11D operate in opposite phase. At this time, in the fundamental waves of the first power amplifier 11C and the second power amplifier 11D, the currents are in opposite phase, that is, the currents flow in opposite directions. Therefore, no current of the fundamental wave flows into the power line PS2 and the line leading to the ground. Because of this, in the differential amplifier circuit 100A, an unwanted current flow into the power line PS2 and the foregoing line can be ignored. This can suppress a decrease in power gain that can be seen in power amplifiers in the related art. Further, in the differential amplifier circuit 100A, the use of two power amplifiers 11C and 11D can reduce an impedance ratio of a composite output impedance of two power amplifiers 11C and 11D to an input impedance of circuit elements connected to the output side of the differential amplifier circuit 100A. Thus, it becomes possible to reduce the matching loss in an amplified radio frequency signal. Moreover, in the differential amplifier circuit 100A, a non-inverted input signal amplified by the first power amplifier 11C and an inverted input signal amplified toy the second power amplifier 11D are combined, and this can cancel out noise components similarly overlapped on both the non-inverted input signal and the inverted input signal. For example, it becomes possible to reduce unwanted waves such as harmonic wave components or the like.

Note that the amplifying element 11E is not an essential constituent element for the differential amplifier circuit 100A. Further, the circuit configuration of the unbalanced-to-balanced transformer circuit 110 is not limited to a particular configuration. Further, the capacitor C11 is not an essential constituent element in the impedance matching.

The circuit configuration of the differential amplifier circuit 100B is similar to the circuit configuration of the differential amplifier circuit 100A. In the differential amplifier circuit 100B, power amplifiers 11F and 11G and an output matching circuit 13F of the differential amplifier circuit 100B correspond to the power amplifiers 11A and 11B and the output matching circuit 130 of the differential amplifier circuit 100A, respectively. The differential amplifier circuit 100A is provided between the signal input terminal 82A and the common terminal 50 of the second switch 5. The differential amplifier circuit 100B is provided between the signal input terminal 82B and the selection terminal 71 of the fourth switch 7.

Next, the structure of the radio frequency module 1e is described with reference to FIG. 10A, FIG. 10B, FIG. 11, and FIG. 12.

In the differential amplifier circuit 100A, the first power amplifier 11C and the second power amplifier 11D have the same specifications and the same chip size. In the differential amplifier circuit 100B (see FIG. 13), the first power amplifier 11F and the second power amplifier 11G have the same specifications and the same chip size.

The first power amplifier 11C and the second power amplifier 11D of the differential amplifier circuit 100A are arranged on the first principal surface 91 of the first wiring board 9. Further, the first power amplifier 11F and the second power amplifier 11G of the differential amplifier circuit 100B are arranged on the first principal surface 91 of the first wiring board 9.

In the differential amplifier circuit 100A, of the plurality of inductor parts L11A, L11B, L12, and L13, the inductor part L11A closest to the output pad electrode 112C of the first power amplifier 11C is a line inductor 95A. Further, in the differential amplifier circuit 100A, of the plurality of inductor parts L1LA, L11B, L12, and L13, the inductor part L11B closest to the output pad electrode 112D of the second power amplifier 11D is a line inductor.

In the differential amplifier circuit 100A, the plurality of capacitors C11, C12, and C13 are surface-mounted electronic components and are arranged on the first principal surface 91 of the first wiring board 9.

Figure 12:
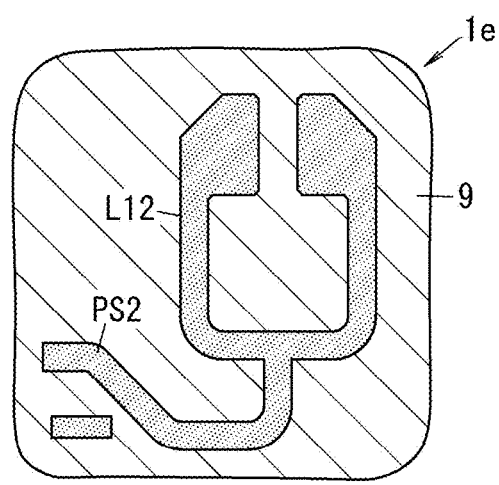
FIG. 12 is a partially broken cross-sectional diagram of the radio frequency module.

In the differential amplifier circuit 100A, the second inductor part L12 that constitutes the primary coil of the transformer T1 is an inner layer inductor part provided in the inside of the first wiring board 9 as illustrated in FIG. 10A, FIG. 10B, and FIG. 12.

Figure 11:
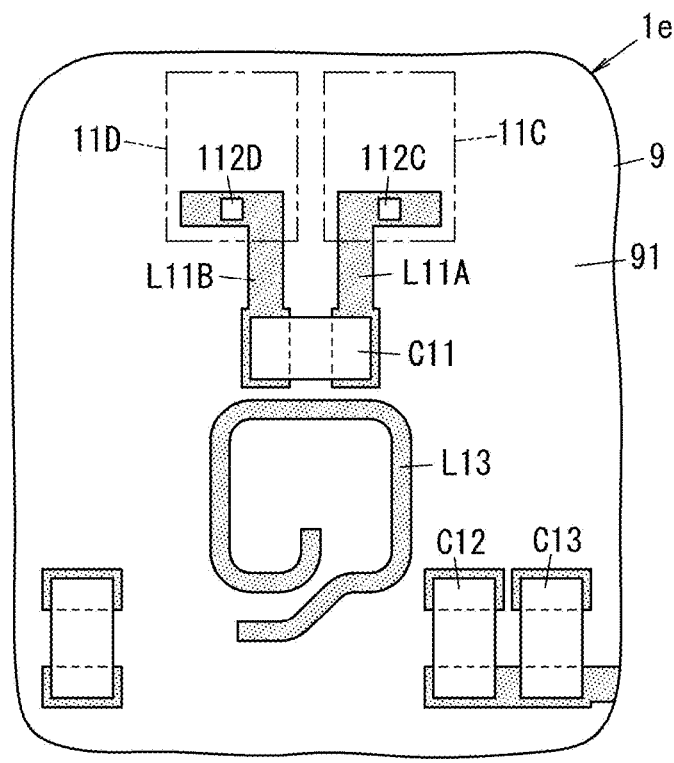
FIG. 11 is a partially broken plan view of the radio frequency module.

In the differential amplifier circuit 100A, the third inductor part L13 that constitutes the secondary coil of the transformer T1 is a line inductor arranged on the first principal surface 91 of the first wiring board 9 as illustrated in FIG. 10A, FIG. 10B, and FIG. 11. In the transformer T1, part of the third inductor part L13 and part of the second inductor part L12 overlap each other in plan view seen from the thickness direction D1 of the first wiring board 9 in such a way that the primary coil and the secondary coil are magnetically coupled. In the thickness direction D1 of the first wiring board 9, part of the first wiring board 9 is interposed between the third inductor part L13 and the second inductor part L12. In the transformer T1, the entirety of the third inductor part L13 and the entirety of the second inductor part L12 may overlap each other in plan view seen from the thickness direction D1 of the first wiring board 9.

As described above, the circuit configuration of the differential, amplifier circuit 100B is similar to the circuit configuration of the differential amplifier circuit 100A. The arrangement of respective circuit element parts of the differential amplifier circuit 100B is similar to the arrangement of respective circuit element parts of the differential amplifier circuit 100A.

The radio frequency module 1e according to the second embodiment includes the first wiring board 9, the second wiring board 10, the power amplifier 11C, the output matching circuit 13C, and the external connection terminals 80. The first wiring board 9 has the first principal surface 91 and the second principal surface 92 that face each other. The second wiring board 10 has the third principal surface 101 and the fourth principal surface 102 that face each other. The second wiring board 10 is separated from the first wiring board 9 in the thickness direction D1 of the first wiring board 9. The power amplifier 11C has the output, pad electrode 112C. The output matching circuit 13C includes the plurality of the inductor parts L11A, L11B, L12, and L13 and is connected to the output pad electrode 112C of the power amplifier 110. In the radio frequency module 1e, the second principal surface 92 of the first wiring board 9 and the third principal surface 101 of the second wiring board 10 face each other. The external, connection terminals 80 are arranged on the fourth principal surface 102 of the second wiring board 10. The power amplifier 11C is arranged on the first principal surface 91 of the first wiring board 9. In the output matching circuit 13C, the first inductor part, which is the inductor part L11A closest to the output pad electrode 112C of the plurality of inductor parts L11A, L11B, L12, and L13, is arranged on the first principal surface 91 of the first, wiring board 9.

The radio frequency module 1e according to the second embodiment can improve the Q factor of the inductor part L11A included in the output matching circuit 13C connected to the power amplifier 11C. Here, in the radio frequency module 1e according to the second embodiment, the inductor part L11A is arranged on the first principal surface 91 of the first wiring board 9. This can reduce the parasitic capacitance formed between the inductor part L11A and the ground of the circuit board 323 or the like and improve the Q factor of the inductor part L11A.

Further, the radio frequency module 1e according to the second embodiment further includes the second power amplifier 11D and the unbalanced-to-balanced transformer circuit 130. The second power amplifier 11D is an amplifier different from the first power amplifier that is the power amplifier 11C. The second power amplifier 110 has the output pad electrode 112D. The unbalanced-balanced transformer circuit 110 has the unbalanced terminal, the first balanced terminal, and the second balanced terminal. The second power amplifier 11D is arranged on the first principal surface 91 of the first wiring board 9. The first balanced terminal of the unbalanced-to-balanced transformer circuit 110 is connected to the first power amplifier 11C, and the second balanced terminal of the unbalanced-to-balanced transformer circuit 110 is connected to the second power amplifier 11D. The first inductor part L11A is connected to the output pad electrode 112C of the first power amplifier 11C. The plurality of inductor parts L11A, L11B, L12, and L13 include an other first inductor part L11B that is different from the first inductor part L11A. The other first inductor part L11B is connected to the output pad electrode 112D of the second power amplifier 11D. In the output matching circuit 13C, at least part of the other first inductor part L11B is arranged on the first, principal surface 91 of the first wiring board 9, and this output matching circuit 13C includes the transformer T1 in which the primary coil is the second inductor part L12 and the secondary coil is the third inductor part L13 of the plurality of inductor parts L11A, L11B, L12, and L13, other than the first inductor part L11A and the other first inductor part L11B. The radio frequency module 1e includes the differential amplifier circuit 100A including the first power amplifier 11C, the second power amplifier 110, and the transformer T1. This enables the radio frequency module 1e according to the second embodiment to suppress a decrease in power gain.

The first and second embodiments described above are only some of various embodiments of the present disclosure. The embodiment described above may be modified in various ways according to the design or the like so long as the object of the present disclosure is achieved.

Instead of the diplexer 3, each of the radio frequency modules 1 and 1a to 1e may only include the first filter (low pass filter) or may include a multiplexer (for example, triplexer). The multiplexer includes, for example, at least two filters out of a low pass filter, a band pass filter, and a high pass filter.

Note that in the radio frequency modules 1 and 1a to 1e, the transmission filter 12A and the reception filter 22A may constitute a duplexer. Further, in the radio frequency module 1, the transmission filter 12B and the reception filter 22B may constitute a duplexer.

The number of selection terminals in each of the first switch 4, the second switch 5, the third switch 6, and the fourth switch 7 may only need to be a plural number and is not limited to the exemplified number.

Instead of being controlled by the controller, each of the first, switch 4 and the second switch 5 may be controlled, for example, by a control signal from the RF signal processing circuit 302 of the signal processing circuit 301.

Further, the acoustic wave filter is not limited to the acoustic wave filter that uses a surface acoustic wave and may alternatively be, for example, an acoustic wave filter that uses a boundary acoustic wave, a lamb wave, or the like.

Further, in the acoustic wave filter, each of the plurality of series arm resonators and the plurality of parallel arm resonators is not limited to a SAW resonator and may alternatively be, for example, a bulk acoustic wave (BAW) resonator.

In the radio frequency modules 1, 1a, 1b, 1c, and 1e, a top end part of each of the plurality of external connection terminals 80 may include, for example, a gold plating.

Further, instead of the radio frequency module 1, the communication device 300 according to the first embodiment may include any one of the radio frequency modules 1a, 1b, 1c, and 1d.

(Aspects)

In the present specification, the following aspects are disclosed.

The radio frequency module (1; 1a; 1b; 1c; 1d; 1e) according to a first aspect includes the first wiring board (9), the second wiring board (10), the power amplifier (11A; 11C), the output matching circuit (13A; 130), and the external connection terminal (30). The first wiring board (9) has the first principal surface (91) and the second principal surface (92) that face each other. The second wiring board (10) has the third principal surface (101) and the fourth principal surface (102) that face each other. The second wiring board (10) is separated from the first wiring board (9) in the thickness direction (D1) of the first wiring board (9). The power amplifier (11A; 11C) has the output pad electrode (112A; 112C). The output matching circuit (13A; 13C) includes the plurality of the inductor parts (L1, L2; L11A, L11B, L12, L13) and is connected to the output pad electrode (112A; 112C) of the power amplifier (11A; 11C). In the radio frequency module (1; 1a; 1b; 1c; 1d; 1e), the second principal surface (92) of the first wiring board (9) and the third principal surface (101) of the second wiring board (10) face each other. The external connection terminal (80) is arranged on the fourth principal surface (102) of the second wiring board (10). The power amplifier (11A; 11C) is arranged on the first principal surface (91) of the first wiring board (9). In the output matching circuit (13A; 13C), at least; part of the first inductor part, which is the inductor part (L1; L11A) closest to the output pad electrode (112A; 112C of the plurality of inductor parts (L1, L2; L11A, L11B, L12, L13), is arranged on the first principal surface (91) of the first wiring board (9).

The radio frequency module (1; 1a; 1b; 1c; 1d; 1e) according to the first aspect can improve the Q factor of the inductor part (L1; L11A) included in the output matching circuit (13A; 13C) connected to the power amplifier (11A; 11C).

In the radio frequency module (1; 1a; 1b; 1c; 1d; 1e) according to a second aspect, an entirety of the first inductor part (L1; L11A) is arranged on the first principal surface (91) of the first wiring board (9) in the first aspect.

The radio frequency module (1; 1a; 1b; 1c; 1d; 1e) according to the second aspect can improve the Q factor of the inductor part (L1) compared with the case where only part of the first inductor part (L1; L11A) is arranged on the first principal surface (91) of the first wiring board (9).

In the radio frequency module (1; 1e) according to a third aspect, the first inductor part (inductor part L1; inductor part L11A) is the line inductor (95; 95A) in the first or second aspect.

The radio frequency module (1; 1e) according to the third aspect can reduce the profile height.

In the radio frequency module (1a) according to a fourth aspect, the first inductor part (inductor part L1) is the chip inductor (15) in the first or second aspect.

The radio frequency module (1a) according to the fourth aspect can improve the Q factor of the first inductor part (inductor part L1).

The radio frequency module (1e) according to a fifth aspect further includes the second power amplifier (11D) and the unbalanced-to-balanced transformer circuit (110) in the first or second aspect. The second power amplifier (11D) is an amplifier different from the first power amplifier that is the power amplifier (11C). The second power amplifier (11D) has the output pad electrode (112D). The unbalanced-balanced transformer circuit (110) has the unbalanced terminal, the first balanced terminal, and the second balanced terminal. The second power amplifier (11D) is arranged on the first principal surface (91) of the first wiring board (9). The first balanced terminal of the unbalanced-to-balanced transformer circuit (110) is connected to the first power amplifier, and the second balanced terminal of the unbalanced-to-balanced transformer circuit (110) is connected to the second power amplifier (11D). The first, inductor part (L11A) is connected to the output pad electrode (112C) of the first power amplifier. The plurality of inductor parts (L11A, L11B, L12, L13) include an other first inductor part (L11B) that is an inductor part different from the first inductor part (L11A). The other first inductor part (L11B) is connected to the output pad electrode (112D) of the second power amplifier (11D). In the output matching circuit (13C), at least part of the other first inductor part (L11B) is arranged on the first principal surface (91) of the first wiring board (9), and this output matching circuit (13C) includes the transformer (T1) in which the primary coil is the second inductor part (L12) and the secondary coil is the third inductor part (L13) of the plurality of inductor parts (L11A, L11B, L12, L13), other than the first inductor part (L11A) and the other first, inductor part (L11B). The radio frequency module (1e) includes the differential amplifier circuit (100A) including the first power amplifier, the second power amplifier (11D), and the transformer (T1).

The radio frequency module (1e) according to the fifth aspect can suppress a decrease in power gain.

In the radio frequency module (1e) according to a sixth aspect, the second inductor part (inductor part L12) is the inner layer inductor part provided in the inside of the first wiring board (9) in the fifth aspect.

The radio frequency module (1e) according to the sixth aspect can be reduced in size in plan view seen from the thickness direction (D1) of the first wiring board (9).

The radio frequency module (1; 1a; 1b; 1c; 1d; 1e) according to a seventh aspect, further includes the penetration electrode (94) in any one of the first to sixth aspects. The penetration electrode (94) overlaps the power amplifier (11A; 11C) in plan view seen from the thickness direction (D1) of the first wiring board (9). The penetration electrode (94) is connected to the power amplifier (11A; 11C) and penetrates through the first wiring board (9) and the second wiring board (10).

The radio frequency module (1; 1a; 1b; 1c; 1d; 1e) according to the seventh aspect can improve the heat dissipation ability because the heat generated in the power amplifier (11A; 11C) is dissipated through the penetration electrode (94).

The radio frequency module (1; 1a; 1b; 1c; 1d; 1e) according to an eighth aspect further includes a low noise amplifier (21A, 21B) arranged on the second wiring board (10) in any one of the first, to seventh aspects.

The radio frequency module (1; 1a; 1b; 1c; 1d; 1e) according to the eighth aspect can amplify a received signal with the low noise amplifier (21A, 21B) and improve the isolation between the power amplifier (11A; 11C) and the low noise amplifier (21A, 21B).

In the radio frequency module (1; 1a; 1b; 1c; 1d; 1e) according to a ninth aspect, the low noise amplifier (21A, 21B) is arranged on the fourth principal surface (102) of the second wiring board (10) in the eighth aspect.

The radio frequency module (1; 1a; 1b; 1c; 1d; 1e) according to the ninth aspect can improve the isolation between the power amplifier (11A; 11C) and the low noise amplifier (21A, 21B).

In the radio frequency module (1; 1a; 1b; 1c; 1d; 1e) according to a tenth aspect, in plan view seen from the thickness direction (D1) of the first wiring board (9), the power amplifier (11A; 11C) and the low noise amplifier (21A; 21B) do not overlap with one another in the eighth or ninth aspect.

The radio frequency module (1; 1a; 1b; 1c; 1d; 1e) according to the tenth aspect can improve the isolation between the power amplifier (11A; 11C) and the low noise amplifier (21A, 21B).

The radio frequency module (1; 1a; 1b; 1c; 1d; 1e) according to an eleventh aspect further includes the reception filter (22A, 22B) and the input matching circuit (23A, 23B) in any one of the eighth to tenth aspects. The input matching circuit (23A, 23B) is provided between the reception filter (22A, 22B) and the low noise amplifier (21A, 21B).

In the radio frequency module (1; 1a; 1b; 1c; 1d; 1e) according to a twelfth aspect, the reception filter (22A, 22B) and the input matching circuit (23A, 23B) are arranged on the third principal surface (101) of the second wiring board (10) in the eleventh aspect.

The radio frequency module (1; 1a; 1b; 1c; 1d; 1e) according to the twelfth aspect can improve the isolation of the power amplifier (11A; 11C) from the reception filter (22A, 22B) and the input matching circuit (23A, 23B).

The radio frequency module (1; 1a; 1b; 1c; 1d; 1e) according to a thirteenth aspect further includes the transmission filter (12A) in tee eleventh or twelfth aspect. The transmission filter (12A) is connected to the power amplifier (11A; 11C) via at least the output matching circuit (13A; 13C). In plan view seen from the thickness direction (D1) of the first wiring board (9), the transmission path (Tx11) including the power amplifier (11A; 11C), the output matching circuit (13A; 13C), and the transmission filter (12A) and the reception path (Rx11) including the reception filter (22A), the input matching circuit (23A), and the low noise amplifier (21A) do not overlap with one another.

In the radio frequency module (1; 1a; 1b; 1c; 1d; 1e) according to a fourteenth aspect, a plurality of external connection terminals (80), each of which is the external connection terminal (80) in the radio frequency module (1; 1*a*; 1*b*; 1*c*; 1*d*; 1*e*), are included in the thirteenth aspect.

The plurality of the external connection terminals (80) include the ground terminal (85) connected to the output matching circuit (13A; 13C).

The radio frequency module according to the fourteenth aspect can improve the isolation between the transmission path (Tx11) including the power amplifier (11A) and the reception path (Rx11) including the low noise amplifier (21A).

The communication device (300; 300*e*) according to a fifteenth aspect includes the signal processing circuit (301) and the radio frequency module (1; 1*a*; 1*b*; 1*c*; 1*d*; 1*e*) according to any one of the first to fourteenth aspects. The power amplifier (11A; 11C) of the radio frequency module (1; 1*a*; 1*b*; 1*c*; 1*d*; 1*e*) amplifies and outputs a transmitting signal from the signal processing circuit (301).

The communication device (300; 300*e*) according to the fifteenth aspect can improve the Q factor of the inductor part included in the output matching circuit (13A; 13C) connected to the power amplifier (11; 11C).

REFERENCE SIGNS LIST 1, 1*a*, 1*b*, 1*c*, 1*d*, 1*e* Radio frequency module
3 Diplexer
30 First filter
31 Second filter
4 Switch (First switch)
40 Common terminal
41 to 43 Selection terminal
5 Switch (Second switch)
50 Common terminal
51, 52 Selection terminal
6 Switch (Third switch)
60 Common terminal
61, 62 Selection terminal
7 Switch (Fourth switch)
70 Common terminal
71, 72 Selection terminal
9 First wiring board
91 First principal surface
92 Second principal surface
94 Penetration electrode
941 Conductor part
942 Conductor part
943 Conductor part
10 Second wiring board
101 Third principal surface
102 Fourth principal surface
11A, 11B Power amplifier
11C Power amplifier (First power amplifier)
11D Power amplifier (Second power amplifier)
11F Power amplifier
11G Power amplifier
12A, 12B Transmission filter
13A, 13B Output matching circuit
13C, 13F Output matching circuit
14A, 14B, 14C Matching circuit
15 Chip inductor
16 First resin layer
17 Second resin layer
18 Third resin layer
19 Shield layer
21A, 21B Low noise amplifier
22A, 22B Reception filter
32C transmission/reception filter
80 External connection terminal
81 Antenna terminal
82A, 82B Signal input terminal
83A, 83B Signal output terminal
85 Ground terminal
86 Heat dissipation terminal
100A, 100B Differential amplifier circuit
110 Unbalanced-to-balanced transformer circuit
300 Communication device
301 Signal processing circuit
302 RF signal processing circuit
303 Baseband signal processing circuit
310 Antenna
320 Circuit board
C1, C2, C11, C12, C13 Capacitor
D1 Thickness direction
D2 Thickness direction
L1 Inductor part (First inductor part)
L2 Inductor part
L11A, L11B Inductor part (First inductor part)
L12 Inductor part (Second inductor part)
L13 Inductor part (Third inductor part)
PS1 Power line
PS2 Power line
T1 Transformer
Tx11, Tx12 Transmission path
Rx11, Rx12 Reception path
Vcc1 Bias voltage
Vcc2 Bias voltage

The invention claimed is:

1. A radio frequency module comprising:
a first wiring board having a first principal surface and a second principal surface, the first principal surface and the second principal surface being on opposite sides of the first wiring board;
a second wiring board having a third principal surface and a fourth principal surface, the third principal surface and the fourth principal surface being on opposite sides of the second wiring boards, the second wiring board being separated from the first wiring board in a thickness direction of the first wiring board;
a power amplifier having an output pad electrode;
an output matching circuit including a plurality of inductor parts, the output matching circuit being connected to the output pad electrode of the power amplifier; and
an external connection terminal, wherein
the second principal surface of the first wiring board and the third principal surface of the second wiring board face one another,
the external connection terminal is arranged on the fourth principal surface of the second wiring board,
the power amplifier is arranged on the first principal surface of the first wiring board, and
in the output, matching circuit, at least part of a first inductor part is arranged on the first principal surface of the first wiring board, the first inductor part being an inductor part closest to the output pad electrode of the plurality of inductor parts.

2. The radio frequency module according to claim 1, wherein
an entirety of the first inductor part is arranged on the first principal surface of the first wiring board.

3. The radio frequency module according to claim 1, wherein
the first inductor part is a line inductor.

4. The radio frequency module according to claim 1, wherein
the first inductor part is a chip inductor.

5. The radio frequency module according to claim 1, further comprising:
a second power amplifier having an output pad electrode, the second power amplifier being different from a first power amplifier, the first power amplifier being the power amplifier; and
an unbalanced-to-balanced transformer circuit having an unbalanced terminal, a first balanced terminal, and a second balanced terminal, wherein
the second power amplifier is arranged on the first principal surface of the first wiring board,
the first balanced terminal of the unbalanced-to-balanced transformer circuit is connected to the first power amplifier, and the second balanced terminal of the unbalanced-to-balanced transformer circuit is connected to the second power amplifier,
the first inductor part is connected to the output pad electrode of the first power amplifier,
the plurality of inductor parts include an other first inductor part, the other first inductor part being different from the first inductor part and being connected to the output pad electrode of the second power amplifier, at least part, of the other first, inductor part being arranged on the first principal surface of the first, wiring board,
the output matching circuit includes a transformer in which a primary coil is a second inductor part and a secondary coil is a third inductor part of the plurality of inductor parts, other than the first inductor part and the other first inductor part, and
the radio frequency module includes a differential amplifier circuit including the first power amplifier, the second power amplifier, and the transformer.

6. The radio frequency module according to claim 5, wherein
the second inductor part is an inner layer inductor part provided inside of the first wiring board.

7. The radio frequency module according to claim 1, further comprising:
a penetration electrode that penetrates through the first wiring board and the second wiring board, the penetration electrode being connected to the power amplifier and overlaps the power amplifier in plan view as seen from the thickness direction of the first wiring board.

8. The radio frequency module according to claim 2, further comprising:
a penetration electrode that penetrates through the first wiring board and the second wiring board, the penetration electrode being connected to the power amplifier and overlaps the power amplifier in plan view as seen from the thickness direction of the first wiring board.

9. The radio frequency module according to claim 1, further comprising:
a low noise amplifier arranged on the second wiring board.

10. The radio frequency module according to claim 9, wherein
the low noise amplifier is arranged on the fourth principal surface of the second wiring board.

11. The radio frequency module according to claim 9, wherein
in plan view as seen from the thickness direction of the first wiring board, the power amplifier and the low noise amplifier do not overlap with one another.

12. The radio frequency module according to claim 10, wherein in plan view as seen from the thickness direction of the first wiring board, the power amplifier and the low noise amplifier do not overlap with one another.

13. The radio frequency module according to claim 9, further comprising:
a reception filter; and
an input matching circuit provided between the reception filter and the low noise amplifier.

14. The radio frequency module according to claim 11, further comprising:
a reception filter; and
an input matching circuit provided between the reception filter and the low noise amplifier.

15. The radio frequency module according to claim 14, wherein
the reception filter and the input matching circuit are arranged on the third principal surface of the second wiring board.

16. The radio frequency module according to claim 13, further comprising:
a transmission filter connected to the power amplifier via at least the output matching circuit, wherein
in plan as seen from the thickness direction of the first wiring board, a transmission path including the power amplifier, the output matching circuit, and the transmission filter and a reception path including the reception filter, the input matching circuit, and the low noise amplifier do not overlap with one another.

17. The radio frequency module according to claim 15, further comprising:
a transmission filter connected to the power amplifier via at least the output matching circuit, wherein
in plan as seen from the thickness direction of the first wiring board, a transmission path including the power amplifier, the output matching circuit, and the transmission filter and a reception path including the reception filter, the input matching circuit, and the low noise amplifier do not overlap with one another.

18. The radio frequency module according to claim 16, wherein
a plurality of external connection terminals, each of which is the external connection terminal in the radio frequency module, are included, and
the plurality of the external connection terminals include a ground terminal connected to the output matching circuit.

19. The radio frequency module according to claim 17, wherein
a plurality of external connection terminals, each of which is the external connection terminal in the radio frequency module, are included, and
the plurality of the external connection terminals include a ground terminal connected to the output matching circuit.

20. A communication device comprising:
a signal processing circuit that outputs a transmitting signal; and
a radio frequency module including
a first wiring board having a first principal surface and a second principal surface, the first principal surface and the second principal surface being on opposite sides of the first wiring board,
a second wiring board having a third principal surface and a fourth principal, surface, the third principal surface and the fourth principal surface being on opposite sides of the second wiring boards, the second wiring board being separated from the first wiring board in a thickness direction of the first wiring board, a power amplifier having an output pad electrode, an output matching circuit including a plurality (c) of inductor parts, the output matching circuit being connected to the output pad electrode of the power amplifier, and an external connection terminal, wherein the second principal surface of the first wiring board and the third principal surface of the second wiring board face one another, the external connection terminal is arranged on the fourth principal surface of the second wiring board, the power amplifier is arranged on the first principal surface of the first wiring board, in the output matching circuit, at least part of a first inductor part is arranged on the first principal surface of the first wiring board, the first inductor part being an inductor part closest to the output pad electrode of the plurality of inductor parts, and the power amplifier of the radio frequency module amplifies and outputs the transmitting signal from the signal processing circuit.

* * * * *